US008564190B2

(12) United States Patent
Seo et al.

(10) Patent No.: US 8,564,190 B2
(45) Date of Patent: Oct. 22, 2013

(54) LIGHT-EMITTING ELEMENT AND LIGHTING DEVICE

(75) Inventors: Satoshi Seo, Kanagawa (JP); Takahiro Ushikubo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 303 days.

(21) Appl. No.: 13/033,739

(22) Filed: Feb. 24, 2011

(65) Prior Publication Data

US 2011/0215714 A1    Sep. 8, 2011

(30) Foreign Application Priority Data

Mar. 2, 2010   (JP) .................................. 2010-045987

(51) Int. Cl.
  *H01L 51/50*   (2006.01)
(52) U.S. Cl.
  USPC ............................ 313/504; 428/690; 313/512
(58) Field of Classification Search
  USPC ............................ 313/503, 504, 512; 428/690
  See application file for complete search history.

(56) References Cited

U.S. PATENT DOCUMENTS

| 7,560,862 | B2 |   | 7/2009 | Liao et al. |  |
|---|---|---|---|---|---|
| 7,663,140 | B2 |   | 2/2010 | Yamazaki et al. |  |
| 8,253,126 | B2 | * | 8/2012 | Kang et al. | 257/40 |
| 2006/0040132 | A1 | * | 2/2006 | Liao et al. | 428/690 |
| 2006/0087225 | A1 | * | 4/2006 | Liao et al. | 313/504 |
| 2007/0001588 | A1 | * | 1/2007 | Boroson et al. | 313/504 |
| 2007/0007882 | A1 |   | 1/2007 | Fukuoka et al. |  |
| 2007/0008257 | A1 |   | 1/2007 | Seo et al. |  |
| 2007/0194701 | A1 |   | 8/2007 | Ito et al. |  |
| 2008/0135858 | A1 |   | 6/2008 | Yamazaki et al. |  |
| 2008/0303415 | A1 |   | 12/2008 | Suzuri et al. |  |
| 2010/0140607 | A1 |   | 6/2010 | Yamazaki et al. |  |

FOREIGN PATENT DOCUMENTS

| EP | 1 727 396 A1 | 11/2006 |
|---|---|---|
| JP | 2006-12793 | 1/2006 |
| JP | 2008-518400 | 5/2008 |

OTHER PUBLICATIONS

European Search Report re application No. EP 11155353.3, dated, May 30, 2011.
Liao, L.-S. et al, "54.2: Tandem White OLEDs Combining Fluorescent and Phosphorescent Emission," SID Digest '08: SID International Symposium Digest of Technical Papers, vol. 39, May 20, 2008, pp. 818-821.
Birnstock, J. et al, "54.3: Distinguished Paper: White Stacked OLED with 35 lm/W and 100,000 Hours Lifetime at 1000 cd/m² for Display and Lighting Applications," SID Digest '08: SID International Symposium Digest of Technical Papers, vol. 39, May 20, 2008, pp. 822-825.

* cited by examiner

*Primary Examiner* — Mary Ellen Bowman
(74) *Attorney, Agent, or Firm* — Husch Blackwell LLP

(57) ABSTRACT

To provide a light-emitting element whose power efficiency is improved and which emits light of natural color like light bulb color. In the light-emitting element, at least three light-emitting units are stacked. The emission spectrum of the light-emitting element has two peaks. One of the two peaks is obtained by combining spectra of light emitted from two light-emitting units. The peak is in the yellow to orange wavelength range and has a wavelength greater than or equal to 560 nm and less than 580 nm. Thus, a wavelength range of high luminosity can be used and the power efficiency can be improved. The color of light emitted from the light-emitting element is close to a blackbody locus in a chromaticity diagram, and light of natural color like light bulb color can be achieved.

19 Claims, 29 Drawing Sheets

LIGHT-EMITTING ELEMENT AND LIGHTING DEVICE

BACKGROUND OF THE INVENTION

1. Field of the Invention

The present invention relates to a light-emitting element utilizing electroluminescence. The present invention also relates to a light-emitting device or a lighting device which includes the light-emitting element.

2. Description of the Related Art

In recent years, research and development have been actively conducted on light-emitting elements utilizing electroluminescence. In a basic structure of the light-emitting element utilizing electroluminescence, a layer containing a light-emitting substance (hereinafter, the layer is referred to as a "light-emitting layer") is sandwiched between a pair of electrodes. By applying voltage between the pair of electrodes of the light-emitting element, light can be emitted from the light-emitting substance.

Among light-emitting elements utilizing electroluminescence, a light-emitting element in which an organic compound is used as a light-emitting substance can be formed by stacking thin films. Thus, the thickness and weight of the light-emitting element can be reduced and the area thereof can be easily increased. For that reason, the light-emitting element is expected to be used for an area light source. Further, the light-emitting element is expected to have emission efficiency higher than that of an incandescent lamp or a fluorescent lamp, and thus has attracted attention as a light-emitting element suitable for lighting equipment.

The light-emitting element can emit light of a variety of colors depending on the kind of light-emitting substance. In particular, in consideration of application to lighting, a light-emitting element which can emit white light or light of color close to white with high efficiency has been hoped for.

As a light-emitting element which can emit white light, for example, a white light-emitting element in which a plurality of light-emitting units having emission peaks in the red, green, and blue wavelength ranges are stacked has been proposed (e.g., Patent Document 1). In addition, a white light-emitting element in which two light-emitting units having emission peaks in the wavelength ranges of complementary colors (e.g., blue and yellow) are stacked has been proposed (e.g., Patent Document 2).

REFERENCE

Patent Document 1: Japanese Translation of PCT International Application No. 2008-518400
Patent Document 2: Japanese Published Patent Application No. 2006-12793

SUMMARY OF THE INVENTION

The above white light-emitting element in which the plurality of light-emitting units having emission peaks in the red, green, and blue wavelength ranges are stacked can emit white light because the wavelength ranges of red and blue of low luminosity are used.

Further, in the above light-emitting element in which the two light-emitting units which have emission peaks in the wavelength ranges of complementary colors (e.g., blue and yellow) are stacked, the amount of light of low luminosity color (e.g., blue) is made larger than that of the other color, whereby the light-emitting element can emit white light.

As described above, the previously-proposed light-emitting elements which can emit white light gave priority to white light emission; thus, the light-emitting elements had to use a certain amount of light in a wavelength range of low luminosity. For that reason, there was a limit to improvement in power efficiency. That is because the luminous flux [lm] included in the unit of power efficiency [lm/W] is the physical quantity considering the luminosity.

In view of the above, the top-priority object of one embodiment of the present invention is to improve power efficiency. Another object is to provide a light-emitting element which emits light of color which is not necessarily white but is natural color like light bulb color or warm white. Another object is to provide a lighting device including the light-emitting element as a light source.

One embodiment of the present invention is a light-emitting element in which at least three light-emitting units are stacked. The light-emitting units each include a light-emitting layer which emits light of one color. The emission spectrum of the light-emitting element in which the at least three light-emitting units are stacked has two peaks. One of the two peaks is a peak obtained by combining the spectra of light emitted from two light-emitting units. The peak is located in the yellow to orange wavelength range, and the wavelength of the peak is greater than or equal to 560 nm and less than 580 nm. The other peak is located in the blue wavelength range (i.e., the wavelength greater than or equal to 400 nm and less than 480 nm).

In the above light-emitting element, two of the at least three light-emitting units include light-emitting layers containing light-emitting substances which have peaks of the emission spectra before being combined in the yellow to orange wavelength range. The wavelengths of the peaks of the spectra of light emitted from the two light-emitting units may be the same or different; whereas, when the light-emitting substances contained in the light-emitting layers included in the two light-emitting units are the same, the wavelengths of the peaks of the spectra of light emitted from the two light-emitting units can be the same. When the light-emitting substances contained in the light-emitting layers included in the two light-emitting units are different, the wavelengths of the peaks of the spectra of light emitted from the two light-emitting units can be different. The wavelengths of the peaks may be either the same or different as long as an emission spectrum having one peak which is located in the yellow to orange wavelength range and whose wavelength is greater than or equal to 560 nm and less than 580 nm is obtained by combining the spectra of light emitted from the two light-emitting units.

In the above light-emitting element, a phosphorescent organic compound which emits phosphorescence (also referred to as a phosphorescent compound) is preferably used as the light-emitting substance which has an emission spectrum peak in the yellow to orange wavelength range. The power efficiency in the case of using a phosphorescent compound is three to four times as high as that in the case of using a fluorescent compound. In addition, the lifetime of an element in which a phosphorescent compound which emits yellow or orange light is used is easily increased compared to an element in which a phosphorescent compound which emits blue light is used. In an organic compound, phosphorescence refers to luminescence generated by transition between electron states with different electron spin multiplicities. In general, the ground state of an organic compound is a singlet state. Phosphorescence is luminescence generated by transition from the lowest triplet excited state to the singlet ground state.

In contrast, the other of the at least three light-emitting units includes a light-emitting layer containing a light-emitting substance which has an emission spectrum peak in the blue wavelength range.

In the above light-emitting element, a fluorescent organic compound which emits fluorescence (also referred to as a fluorescent compound) is preferably used as the light-emitting substance which has an emission spectrum peak in the blue wavelength range (i.e., the wavelength greater than or equal to 400 nm and less than 480 nm). The use of a fluorescent compound as the substance which emits blue light makes it possible to obtain a light-emitting element which has a longer lifetime than a light-emitting element in which a phosphorescent compound is used as the substance which emits blue light. In an organic compound, fluorescence refers to luminescence generated by transition between electron states with the same electron spin multiplicities. In general, the ground state of an organic compound is a singlet state. Fluorescence generated by transition from the lowest singlet excited state to the ground state is observed.

The use of the substance which has an emission spectrum peak in the yellow to orange wavelength range makes it possible to utilize the wavelength range of high luminosity and to improve power efficiency. Light-emitting layers containing light-emitting substances which have emission spectrum peaks in the yellow to orange wavelength range are used in two of the at least three light-emitting units, whereby the power efficiency of the whole light-emitting element can be improved. In other words, by stacking a plurality of light-emitting units whose emission spectrum peaks are located in the yellow to orange wavelength range of high luminosity, the power efficiency of the whole light-emitting element can be improved. Such a structure is advantageous in terms of luminosity and power efficiency can be improved in comparison with the case where, for example, a green light-emitting unit and a red light-emitting unit are stacked to obtain light of color ranging from yellow to orange. Further, the emission intensity of light of the blue wavelength range of low luminosity is relatively low in comparison with the case of using one light-emitting unit whose emission spectrum peak is located in the yellow to orange wavelength range of high luminosity; thus, the color of emitted light is close to light bulb color (or warm white), and the power efficiency is improved.

In other words, in the above light-emitting element, the color of light which is obtained by combining light whose emission spectrum peak is in the yellow to orange wavelength range and whose wavelength of the peak is greater than or equal to 560 nm and less than 580 nm and light whose emission spectrum peak is in the blue wavelength range (i.e., the color of light emitted from the light-emitting element) is not white but can be natural color like warm white or light bulb color. In particular, light bulb color can be easily achieved.

In other words, the color of light emitted from the light-emitting element lies close to the blackbody radiation locus (also referred to the blackbody locus) in the chromaticity diagram, and its color temperature is around 3000 K to 3500 K. Specifically, the color according to the emission spectrum of the light-emitting element is in the range of ±0.02 uv from the blackbody locus in the chromaticity diagram, and its color temperature is greater than or equal to 2600 K and less than or equal to 3700 K. The color located near the blackbody locus in the chromaticity diagram indicates natural color close to the color of sunlight. The color which has a color temperature of around 3000 K (greater than or equal to 2600 K and less than or equal to 3150 K) is light bulb color. Further, the color which has a color temperature of around 3500 K (greater than or equal to 3200 K and less than or equal to 3700 K) is warm white.

The inventors found out that effects described below can be obtained by using the above-described phosphorescent compound which has an emission peak in the yellow to orange wavelength range in two of the at least three light-emitting units and the above-described fluorescent compound which has an emission peak in the blue wavelength range in the other light-emitting unit.

First, the power efficiency is maximally improved because two light-emitting units which emit light of color ranging from yellow to orange of high luminosity are used and phosphorescent compounds are used as light-emitting substances in these light-emitting units. In addition, the inventors found out that the color temperature falls within the standard range of light bulb color or warm white (i.e., within the range of ±0.02 uv from the blackbody locus) with the maximum power efficiency maintained, by adding only one light-emitting unit containing a fluorescent compound which emits blue light to those two units. Furthermore, the light-emitting element including the at least three light-emitting units which are obtained in the above manner includes stacked light-emitting units each having a long lifetime as described above, and thus can have a long lifetime.

The inventors also found out that such a structure made it possible to maximally improve the power efficiency of an organic electroluminescence element and to maximally increase the lifetime thereof in the case of color such as light bulb color or warm white. On the other hand, inorganic LED lighting is generally formed by combining a blue LED and a phosphor emitting light of another color; therefore, high power efficiency can be achieved at high color temperature of daylight white (to 5000 K), but the power efficiency is reduced at low color temperature of light bulb color because of the color conversion efficiency of the phosphor. That is to say, lighting using the light-emitting element of one embodiment of the present invention has a property opposite to that of lighting using an LED, and thus is distinctive lighting.

The above light-emitting element includes an anode and a cathode; and a first light-emitting layer, a second light-emitting layer, a third light-emitting layer, a first intermediate layer, and a second intermediate layer between the anode and the cathode. The first intermediate layer is provided between the first light-emitting layer and the second light-emitting layer. The second intermediate layer is provided between the second light-emitting layer and the third light-emitting layer. A first light-emitting unit includes one of the anode and the cathode, the first light-emitting layer, and the first intermediate layer. A second light-emitting unit includes the first intermediate layer, the second light-emitting layer, and the second intermediate layer. A third light-emitting unit includes the second intermediate layer, the third light-emitting layer, and the other of the anode and the cathode.

In the above light-emitting element, the spectra of light emitted from two of the first to third light-emitting layers have peaks in the yellow to orange wavelength range. A spectrum obtained by combining the spectra of light emitted from the two light-emitting layers has one peak, and the wavelength of the peak is greater than or equal to 560 nm and less than 580.

In the above light-emitting element, the spectrum of light emitted from the other light-emitting layer of the first to third light-emitting layers has a peak in the blue wavelength range.

In the above light-emitting element, a material which has functions of injecting electrons into one of the first light-emitting layer and the second light-emitting layer and injecting holes into the other of the first light-emitting layer and the second light-emitting layer can be used for the first intermediate layer. For example, the first intermediate layer can be a stacked-layer film of a layer which injects electrons into one of the first light-emitting layer and the second light-emitting layer and a layer which injects holes into the other of the first light-emitting layer and the second light-emitting layer.

According to one embodiment of the present invention, a plurality of light-emitting units whose emission spectrum peaks are located in the yellow to orange wavelength range of high luminosity are stacked, whereby the power efficiency of the whole light-emitting element can be improved. Furthermore, the color of light emitted from the light-emitting element lies close to the blackbody locus in the chromaticity diagram; thus, light of natural color like light bulb color or warm white can be achieved. Thus, a light-emitting element whose power efficiency is improved and which emits light of natural color like light bulb color or warm white can be provided.

The above light-emitting element emits light of natural color like light bulb color or warm white, and thus can be used as a light source of an indoor lighting device or an outdoor lighting device. The use of the above light-emitting element makes it possible to provide lighting devices which have high power efficiency and consume less power.

DETAILED DESCRIPTION OF THE INVENTION

Embodiment 1

In this embodiment, an example of a structure of a light-emitting element will be described with reference to FIG. 1, FIG. 2, FIG. 3, FIG. 4, and FIG. 5.

Figure 1:
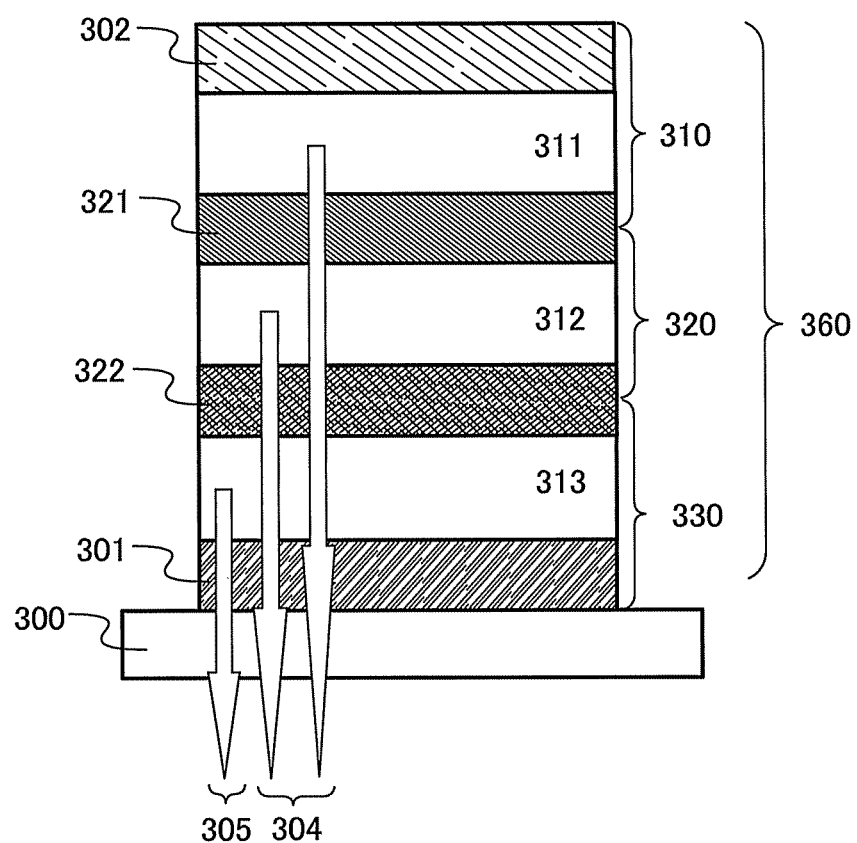
FIG. 1 illustrates an example of a light-emitting element.

A light-emitting element 360 illustrated in FIG. 1 is provided over a substrate 300 and includes an anode 301 and a cathode 302, and a first light-emitting layer 311, a second light-emitting layer 312, a third light-emitting layer 313, a first intermediate layer 321, and a second intermediate layer 322 between the anode 301 and the cathode 302. The first intermediate layer 321 is provided between the first light-emitting layer 311 and the second light-emitting layer 312. The second intermediate layer 322 is provided between the second light-emitting layer 312 and the third light-emitting layer 313. A first light-emitting unit 310 includes the cathode 302, the first light-emitting layer 311, and the first intermediate layer 321. A second light-emitting unit 320 includes the first intermediate layer 321, the second light-emitting layer 312, and the second intermediate layer 322. A third light-emitting unit 330 includes the second intermediate layer 322, the third light-emitting layer 313, and the anode 301. The first light-emitting unit 310, the second light-emitting unit 320, and the third light-emitting unit 330 are connected in series. As described above, the light-emitting element illustrated in FIG. 1 has a structure in which the first light-emitting unit 310, the second light-emitting unit 320, and the third light-emitting unit 330 are stacked. Therefore, the light-emitting element with such a structure is referred to as a stacked light-emitting element. In FIG. 1, the anode 301 is a light-transmitting electrode and the cathode 302 is a light-reflecting electrode.

Figure 2:
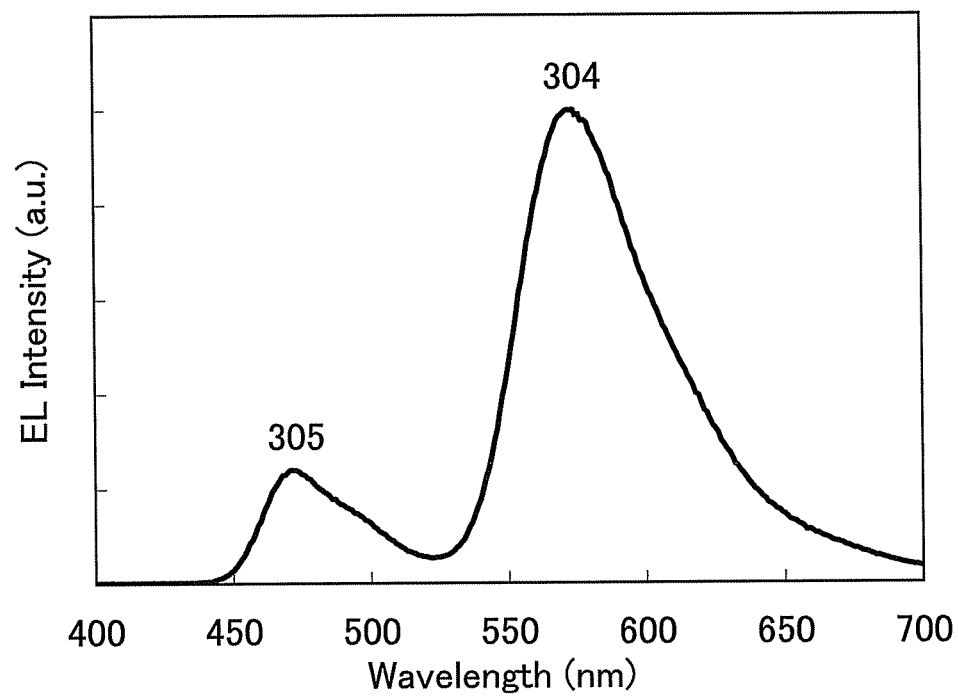
FIG. 2 shows an example of an emission spectrum of the light-emitting element.

FIG. 2 shows an example of the emission spectrum of the light-emitting element 360 illustrated in FIG. 1, in which the at least three light-emitting units are stacked. As shown in FIG. 2, the emission spectrum of the light-emitting element 360 has two peaks. An emission spectrum 304 which has one of the two peaks is obtained by combining emission spectra of light emitted from the first light-emitting unit 310 and the second light-emitting unit 320. The emission spectrum 304 obtained by combining the emission spectra of light emitted from the first light-emitting unit 310 and the second light-emitting unit 320 has a peak in the yellow to orange wavelength range. The emission spectrum 304 obtained by combining the emission spectra of light emitted from the first light-emitting unit 310 and the second light-emitting unit 320 has one peak, and the wavelength of the peak is greater than or equal to 560 nm and less than 580 nm.

An emission spectrum 305 which has the other peak of the emission spectrum of the light-emitting element 360 shown in FIG. 2 is a spectrum of light emitted from the third light-emitting unit. The emission spectrum 305 of the third light-emitting unit has a peak in the blue wavelength range (i.e., wavelength greater than or equal to 400 nm and less than 480 nm).

The first light-emitting unit 310 and the second light-emitting unit 320 each include a light-emitting layer containing a light-emitting substance having an emission spectrum peak in the yellow to orange wavelength range. The wavelengths of the peaks of the spectra of light emitted from these two light-emitting units may be the same or different. When the light-emitting layers included in the two light-emitting units are formed using the same light-emitting substance, the wavelengths of the peaks of light emitted from the two light-emitting units can be the same; whereas, when the light-emitting layers included in the two light-emitting units are formed using different light-emitting substances, the wavelengths of the peaks of the spectra of light emitted from the two light-emitting units can be different. The wavelengths of the peaks may be either the same or different as long as an emission spectrum having one peak which is located in the yellow to orange wavelength range and whose wavelength is greater than or equal to 560 nm and less than 580 nm is obtained by combining the spectra of light emitted from the two light-emitting units.

As for the above light-emitting element, even if wavelengths of the peaks of two emission spectra are different, it is difficult to divide an emission spectrum which is obtained by combining the two emission spectra having the peaks as long as the difference in wavelength between the peaks is small (i.e., the difference is less than or equal to 20 nm); therefore, the emission spectrum can be considered to have one peak.

Figure 3:
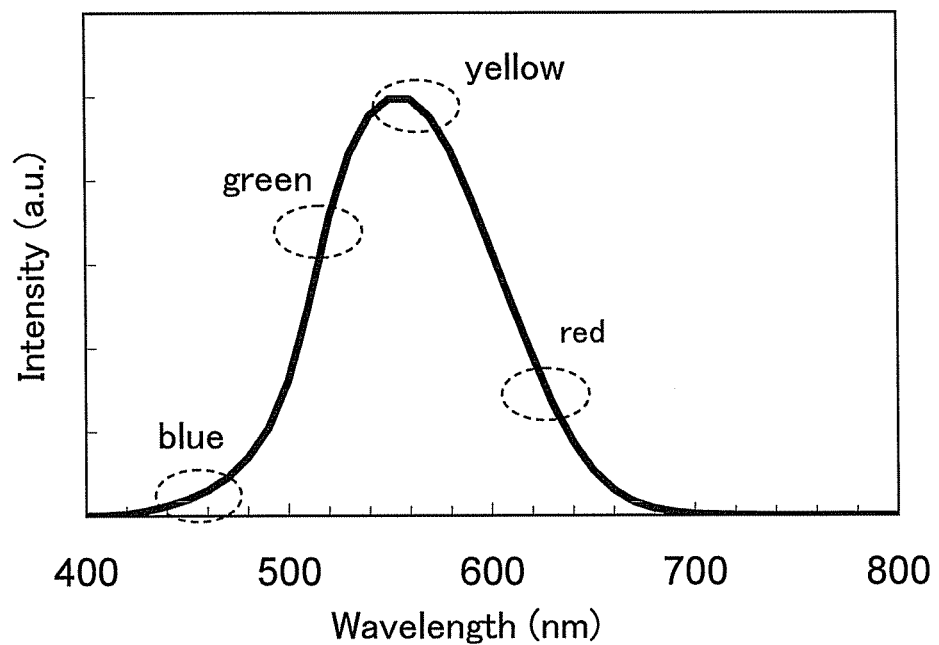
FIG. 3 is the standard relative luminosity curve.

FIG. 3 is the standard relative luminosity curve. The luminosity function is the sensitivity of the human eye to light, which is expressed by a ratio where light with a wavelength of 555 nm to which the human eye has the strongest response is regarded as 1. As shown in the standard relative luminosity curve of FIG. 3, the luminosity of the wavelength range of yellow to orange (color on a little longer wavelength side than yellow) is high. That is to say, when light which has an emission spectrum peak in the yellow to orange wavelength range is used, the wavelength range of high luminosity can be used, and power efficiency can be improved. In other words, the structure of one embodiment of the present invention is advantageous in terms of luminosity and power efficiency can be improved in comparison with the case where, for example, a green light-emitting unit and a red light-emitting unit are stacked to obtain light of yellow or orange.

In the light-emitting element 360 in FIG. 1, light-emitting layers each containing a light-emitting substance which emits light having an emission spectrum peak in the yellow to orange wavelength range are used in two of the at least three light-emitting units (i.e., the first light-emitting unit 310 and the second light-emitting unit 320). The yellow to orange wavelength range is a wavelength range of high luminosity. Thus, two light-emitting units emitting light in the wavelength range of high luminosity are stacked, whereby the power efficiency of the whole light-emitting element can be improved. As for this light-emitting element, the emission intensity of light in the blue wavelength range of low luminosity (i.e., the intensity of light emitted from the third light-emitting unit 330) is relatively low compared to a light-emitting element including one light-emitting emitting unit whose emission spectrum peak is located in the yellow to orange wavelength range of high luminosity; thus, the color of emitted light is close to light bulb color (or warm white) and the power efficiency is improved.

Figure 4:
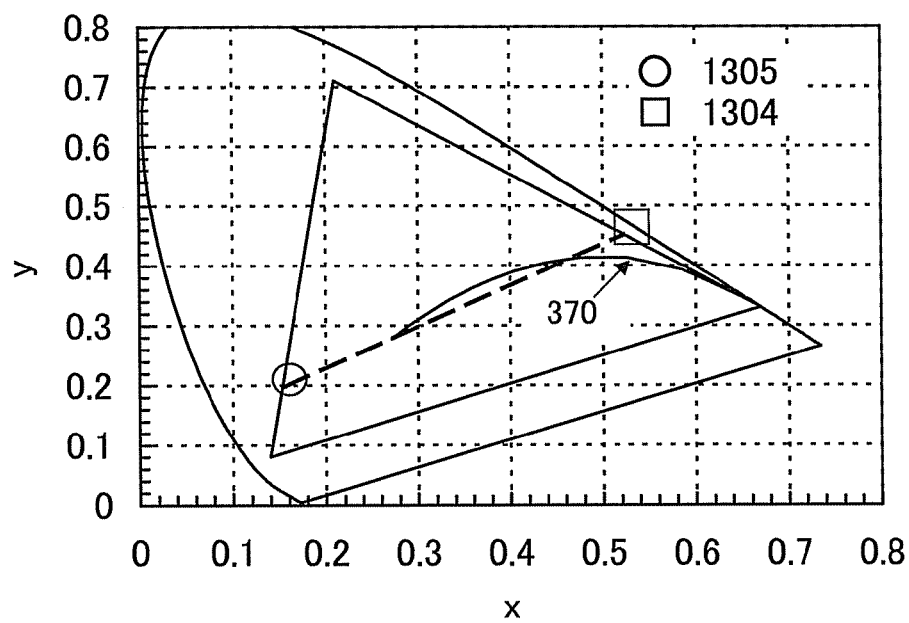
FIG. 4 shows the chromaticity coordinates and the blackbody locus of the emission spectrum of the light-emitting element in the chromaticity diagram.

FIG. 4 is a CIE chromaticity diagram. In the CIE chromaticity diagram of FIG. 4, color coordinates of the emission spectrum 304 and the emission spectrum 305 shown in FIG. 1 and FIG. 2, which are included in the emission spectrum of the light-emitting element 360, are plotted. In FIG. 4, a square mark 1304 represents color coordinates of the color of light having the emission spectrum 304, and a circular mark 1305 represents color coordinates of the color of light having the emission spectrum 305. In addition, a black body radiation locus (also referred to as a blackbody locus) 370 is shown in the CIE chromaticity diagram of FIG. 4.

The color of light emitted from the light-emitting element 360 substantially corresponds to a color represented by the color coordinates on a line (a dotted line in FIG. 4) connecting the mark 1304 and the mark 1305 in the CIE chromaticity diagram of FIG. 4. The intensity ratio between the emission spectrum 304 and the emission spectrum 305 illustrated in FIG. 1 and FIG. 2 basically determines which of the color coordinates on the line corresponds to the color.

As is shown in FIG. 4, the line connecting the mark 1304 and the mark 1305 (the dotted line in FIG. 4) has a portion intersecting with the blackbody locus 370 and lies close to the blackbody locus over a wide range. For example, even when the intensity ratio of the emission spectrum 304 to the emission spectrum 305 ranges from 8:1 to 6:1, the color of light emitted from the light-emitting element 360 can be natural color close to the color of sunlight.

Figure 5:
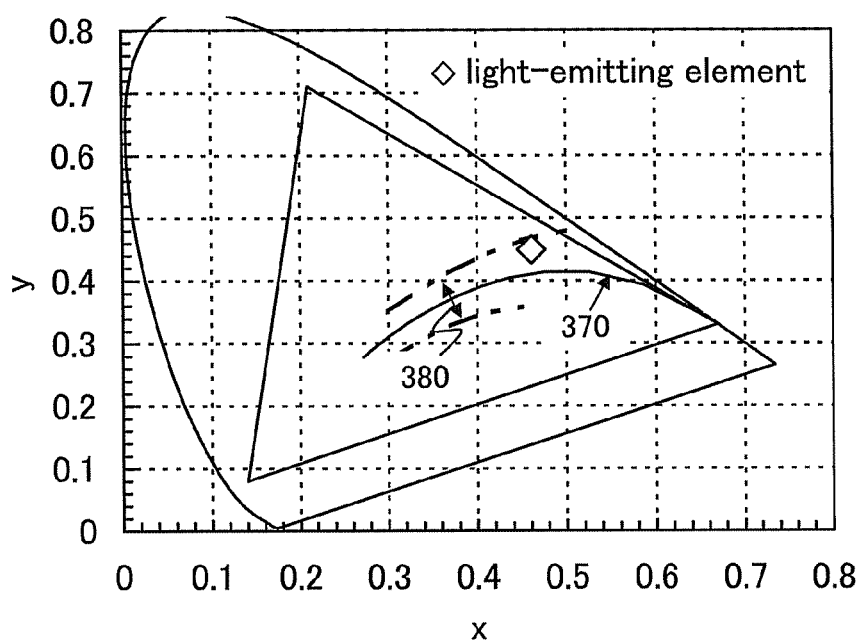
FIG. 5 shows the chromaticity coordinates and the blackbody locus of the emission spectrum of the light-emitting element in the chromaticity diagram.

FIG. 5 is a CIE chromaticity diagram. In the CIE chromaticity diagram of FIG. 5, as an example, color coordinates of the emission spectrum of the light-emitting element 360, which are illustrated in FIG. 1 and FIG. 2, are plotted. In FIG. 5, a diamond-shape mark represents color coordinates of the color of light having the emission spectrum of the light-emitting element 360. In addition, the blackbody locus 370 and a region 380 which is located in the range of ±0.02 uv from the blackbody locus 370 are shown in the CIE chromaticity diagram of FIG. 5.

As is shown in FIG. 5, the color (the color coordinates) of the emission spectrum of the light-emitting element 360 is located in the region 380 which is in the range of ±0.02 uv from the blackbody locus in the CIE chromaticity diagram. According to FIG. 5, it is found that the color (the color coordinates) of the emission spectrum of the light-emitting element 360 lies close to the blackbody locus and is natural color close to the color of sunlight. Further, the color temperature is around 3000 K, which corresponds to light bulb color.

The first light-emitting layer 311 included in the first light-emitting unit 310 and the second light-emitting layer 312 included in the second light-emitting unit 320, which are illustrated in FIG. 1, each contain a light-emitting substance which emits light having a peak in the yellow to orange wavelength range. For example, an organometallic complex in which a pyrazine derivative serves as a ligand can be used as the light-emitting substance which emits light having a peak in the yellow to orange wavelength range. Alternatively, the light-emitting layers can be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative serves as a ligand is a phosphorescent compound, has high emission efficiency, and easily emits light in the yellow to orange wavelength range, and thus is suitable for the present invention.

The third light-emitting layer 313 illustrated in FIG. 1 contains a light-emitting substance which emits light having a peak in the blue wavelength range. For example, a pyrene diamine derivative can be used as the light-emitting substance which emits light having a peak in the blue wavelength range. A fluorescent compound can be used as the light-emitting substance which emits light having a peak in the blue wavelength range. The use of a fluorescent compound as the substance which emits blue light makes it possible to obtain a light-emitting element with lifetime longer than that of a light-emitting element in which a phosphorescent compound is used as a substance which emits blue light. The above pyrene diamine derivative is a fluorescent compound, can obtain an extremely high quantum yield, and has a long lifetime.

As described with reference to FIG. 4, the color of light emitted from the light-emitting element 360 can be natural color close to the color of sunlight even when the intensity ratio of the emission spectrum 304 having a peak in the yellow to orange wavelength range to the emission spectrum 305 having a peak in the blue wavelength range ranges from 8:1 to 6:1.

Now, a light-emitting element is considered in which two light-emitting units which emit light of color ranging from yellow to orange and are formed using a phosphorescent compound and one light-emitting unit which emits blue light and is formed using a fluorescent compound are stacked. In that case, the intensity ratio of the emission spectrum 304 having a peak in the yellow to orange wavelength range to the emission spectrum 305 having a peak in the blue wavelength range is approximately in the range of 8:1 to 6:1. Thus, the color of light emitted from the above light-emitting element can be natural color close to the color of sunlight. In addition, two light-emitting units which emit light of color ranging from yellow to orange of high luminosity are used and phosphorescent compounds are used as the light-emitting substances of these light-emitting units; thus, the power efficiency is maximally increased. Furthermore, the light-emitting element including the at least three light-emitting units which are obtained in the above manner includes stacked light-emitting units each having a long lifetime as described above, and thus can have a long lifetime.

With such a structure, the power efficiency and lifetime of an organic electroluminescence element can be maximally increased when it emits light of color such as light bulb color or warm white. On the other hand, inorganic LED lighting is generally formed by combining a blue LED and a phosphor emitting light of another color; therefore, high power efficiency can be achieved at high color temperature of daylight white (to 5000 K), but the power efficiency is reduced at low color temperature of light bulb color because of the color conversion efficiency of the phosphor. That is to say, lighting using the light-emitting element of one embodiment of the present invention has a property opposite to lighting using an LED, and thus is distinctive lighting.

Note that the first light-emitting unit 310 and the second light-emitting unit 320 may be stacked in reverse order. Note also that the first light-emitting unit 310, the second light-emitting unit 320, and the third light-emitting unit 330 may be stacked in reverse order to that illustrated in FIG. 1.

According to this embodiment, the power efficiency of the whole light-emitting element can be improved by stacking a plurality of light-emitting units whose emission spectrum peaks are located in the yellow to orange wavelength range of high luminosity. Furthermore, the color of light emitted from the light-emitting element lies close to the blackbody locus in the chromaticity diagram; thus, the light-emitting element can emit light of natural color like light bulb color or warm white. Thus, a light-emitting element whose power efficiency is improved and which emits light of natural color like light bulb color can be provided.

According to this embodiment, the color of light emitted from a light-emitting element can be natural color close to the color of sunlight even in the case where the light-emitting element has a structure in which a phosphorescent compound is used for two light-emitting units which emit light of color ranging from yellow to orange and a fluorescent compound is used for one light-emitting unit which emits blue light, and the at least three light-emitting units are stacked. Thus, a light-emitting element which has high power efficiency and a long lifetime and emits light of natural color can be provided.

The light-emitting element described in this embodiment emits light of natural color, and thus can be used as a light source of an indoor lighting device or an outdoor lighting device. The use of the light-emitting element described in this embodiment enables manufacture of a lighting device which has high power efficiency and consumes less power.

This embodiment can be combined with any of the other embodiments and examples as appropriate.

Embodiment 2

In this embodiment, an example of a structure of a light-emitting element will be described with reference to FIG. 1. In this embodiment, the structure of the light-emitting element 360 illustrated in FIG. 1, which is described in Embodiment 1, will be specifically described.

As described in Embodiment 1, the light-emitting element 360 illustrated in FIG. 1 is provided over the substrate 300 and includes the anode 301 and the cathode 302, and the first light-emitting layer 311, the second light-emitting layer 312, the third light-emitting layer 313, the first intermediate layer 321, and the second intermediate layer 322 between the anode 301 and the cathode 302. The first intermediate layer 321 is provided between the first light-emitting layer 311 and the second light-emitting layer 312. The second intermediate layer 322 is provided between the second light-emitting layer 312 and the third light-emitting layer 313. The first light-emitting unit 310 includes the cathode 302, the first light-emitting layer 311, and the first intermediate layer 321. The second light-emitting unit 320 includes the first intermediate layer 321, the second light-emitting layer 312, and the second intermediate layer 322. The third light-emitting unit 330 includes the second intermediate layer 322, the third light-emitting layer 313, and the anode 301. The first light-emitting unit 310, the second light-emitting unit 320, and the third light-emitting unit 330 are connected in series. As described above, the light-emitting element illustrated in FIG. 1 has a structure in which the first light-emitting unit 310, the second light-emitting unit 320, and the third light-emitting unit 330 are stacked. Therefore, the light-emitting element with such a structure is referred to as a stacked light-emitting element. In FIG. 1, the anode 301 is a light-transmitting electrode and the cathode 302 is a light-reflecting electrode.

The first light-emitting layer 311 included in the first light-emitting unit 310 and the second light-emitting layer 312 included in the second light-emitting unit 320 each include a light-emitting substance which emits light having a peak in the yellow to orange wavelength range. As a light-emitting substance which emits light having a peak in the yellow to orange wavelength, the following can be used: rubrene; (2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); bis[2-(2-thienyl)phridinato]iridium acetylacetonate (abbreviation: Ir(thp)$_2$(acac)); bis(2-phenylquinolinato)iridium acetylacetonate (abbreviation: Ir(pq)$_2$(acac)); tris(2-phenylquinolinato-N,C$^{2'}$)iridium(III) (abbreviation: Ir(pq)$_3$); bis(2-phenylbenzothiazolato-N,C$^{2'}$)iridium(III) acetylacetonate (abbreviation: Ir(bt)$_2$(acac)); (acetylacetonato)bis[2,3-bis(4-fluorophenyl)-5-methylpyrazinato]iridium(III) (abbreviation: Ir(Fdppr-Me)$_2$(acac)); (acetylacetonato)bis{2-(4-methoxyphenyl)-3,5-dimethylpyrazinato}iridium(III) (abbreviation: Ir(dmmoppr)$_2$(acac)); (acetylacetonato)bis(3,5-dimethyl-2-phenylpyrazinato)iridium(III) (abbreviation: Ir(mppr-Me)$_2$(acac)); (acetylacetonato)bis(5-isopropyl-3-methyl-2-phenylpyrazinato)iridium(III) (abbreviation: Ir(mppr-iPr)$_2$(acac)); or the like. As described above, the following phosphorescent compounds are preferable as the light-emitting substance which emits light having a peak in the yellow to orange wavelength range: Ir(thp)$_2$(acac), Ir(pq)$_2$(acac), Ir(pq)$_3$, Ir(bt)$_2$(acac), Ir(Fdppr-Me)$_2$(acac), Ir(dmmoppr)$_2$(acac), Ir(mppr-Me)$_2$(acac), and Ir(mppr-iPr)$_2$(acac). In particular, an organometallic complex in which a pyrazine derivative serves as a ligand, such as Ir(Fdppr-Me)$_2$(acac), Ir(dmmoppr)$_2$(acac), Ir(mppr-Me)$_2$(acac), Ir(mppr-iPr)$_2$(acac) are preferable because high efficiency is obtained. In addition, any of these light-emitting substances (a guest material) may be dispersed into another substance (a host material) to form the light-emitting layer. As a host material in that case, the following compounds are preferable: aromatic amine compounds such as 4,4'-bis[N-(1-naphthyl)-N-phenylamino]biphenyl (abbreviation: NPB) and 4-(9H-carbazol-9-yl)-4'-(10-phenyl-9-anthryl)triphenylamine (abbreviation: YGAPA); and heterocyclic compounds such as 2-[4-(9H-carbazol-9-yl)phenyl]-3-phenylquinoxaline (abbreviation: Cz1PQ), 2-[4-(3,6-diphenyl-9H-carbazol-9-yl)phenyl]-3-phenylquinoxaline (abbreviation: Cz1PQ-III), 2-[4-(3,6-diphenyl-9H-carbazol-9-yl)phenyl]dibenzo[f,h]quinoxaline (abbreviation: 2CzPDBq-III), and 2-[3-(dibenzothiophen-4-yl)phenyl]dibenzo[f,h]quinoxaline (abbreviation: 2mDBTP-DBq-II). Alternatively, a polymer, such as poly(2,5-dialkoxy-1,4-phenylenevinylene) may be used.

The third light-emitting layer 313 contains a light-emitting substance which emits light having a peak in the blue wavelength range. As a light-emitting substance which emits light having a peak in the blue wavelength range, perylene; 2,5,8,11-tetra(tert-butyl)perylene (abbreviation: TBP); or the like can be used. A styrylarylene derivative such as 4,4'-bis(2,2-diphenylvinyl)biphenyl (abbreviation: DPVBi), or an anthracene derivative such as 9,10-diphenylanthracene, 9,10-di(2-naphthyl)anthracene (abbreviation: DNA), or 9,10-bis(2-naphthyl)-2-tert-butylanthracene (abbreviation: t-BuDNA) can be used. A polymer such as poly(9,9-dioctylfluorene) can be used. A styrylamine derivative such as N,N'-bis[4-(9H-carbazol-9-yl)phenyl]-N,N'-diphenylstilbene-4,4'-diamine (abbreviation: YGA2S) or N,N'-diphenyl-N,N'-bis(9-phenyl-9H-carbazol-3-yl)stilbene-4,4'-diamine (PCA2S) can be used. A pyrenediamine derivative such as N,N'-bis[4-(9-phenyl-9H-fluoren-9-yl)phenyl]-N,N'-diphenylpyrene-1,6-diamine (abbreviation: 1,6-FLPAPrn) or N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn) can be used. As the light-emitting substance which emits light having a peak in the blue wavelength range, a fluorescent compound is preferably used as described above. In particular, pyrenediamine derivatives such as 1,6-FLPAPrn and 1,6tBu-FLPAPrn are preferable because it has a peak at a wavelength of around 460 nm, has an extremely high quantum yield, and has a long lifetime. In addition, any of these light-emitting substances (a guest material) may be dispersed into another substance (a host material) to form the light-emitting layer. As a host material in that case, an anthracene derivative is preferable, examples of which are 9,10-bis(2-naphthyl)-2-tert-butylanthracene (abbreviation: t-BuDNA), 9-[4-(10-phenyl-9-anthryl)phenyl]-9H-carbazole (abbreviation: CzPA), and 9-phenyl-3-[4-(10-phenyl-9-anthryl)phenyl]-9H-carbazole (abbreviation: PCzPA). In particular, CzPA and PCzPA are preferable because they are electrochemically stable.

Note that the emission colors of the light-emitting substances given above may change to some extent depending on the host material or the element structure.

Note that the first light-emitting unit 310 and the second light-emitting unit 320 may be stacked in reverse order. Note also that the first light-emitting unit 310, the second light-emitting unit 320, and the third light-emitting unit 330 may be stacked in reverse order to that illustrated in FIG. 1.

In FIG. 1, the substrate 300 is used as a support of the light-emitting element. The substrate 300 can be made of, for example, glass or plastic. Alternatively, another material may be used as long as the substrate functions as a support in a manufacturing process of the light-emitting element.

A variety of metals, alloys, other conductive materials, and a mixture thereof can be used for the anode 301 and the cathode 302. For example, it is possible to use a film of conductive metal oxide such as indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide (IWZO), which has a high work function. Films of these metal oxides can be formed by a sputtering method, a sol-gel method, or the like. For example, a film of indium oxide-zinc oxide (IZO) can be formed by a sputtering method using a target in which zinc oxide is added to indium oxide at 1 wt % to 20 wt %. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride (TiN)), or the like can be used. Alternatively, any of elements belonging to Group 1 and 2 of the periodic table, which have a low work function, that is, alkali metals such a lithium (Li) and cesium (Cs) and alkaline earth metals such as magnesium (Mg), calcium (Ca), and strontium (Sr); or alloys containing these metals (e.g., an alloy of magnesium and silver or an alloy of aluminum and lithium) can be used. Further alternatively, a rare earth metal such as europium (Eu), ytterbium (Yb), or the like, an alloy of any of these metals, or the like may be used. Alternatively, aluminum (Al), silver (Ag), an alloy containing aluminum (AlSi), or the like can be used. A film of an alkali metal, an alkaline earth metal, or an alloy thereof can be formed by a vacuum evaporation method. A film of an alloy containing an alkali metal or an alkaline earth metal can be formed by a sputtering method. Further, the structure of each electrode is not limited to a single-layer film and may be a stacked-layer film.

Note that a material with a high work function is preferably used for anode in consideration of a carrier injection barrier. In addition, a material with a low work function is preferably used for the cathode.

The first intermediate layer 321 has a function of injecting holes in the first light-emitting unit 310 and has a function of injecting electrons in the second light-emitting unit 320. The second intermediate layer 322 has a function of injecting holes in the second light-emitting unit 320 and has a function of injecting electrons in the third light-emitting unit 330. Thus, a structure in which at least a layer which has a function of injecting holes and a layer which has a function of injecting electrons are stacked can be employed for the first intermediate layer 321 and the second intermediate layer 322.

Further, the first intermediate layer 321 and the second intermediate layer 322 are positioned inside the light-emitting element, and thus are preferably formed using a light-transmitting material in terms of light extraction efficiency. Part of each of the first intermediate layer 321 and the second intermediate layer 322 can be formed using a material which is used for the anode and the cathode. Alternatively, the first intermediate layer 321 and the second intermediate layer 322 can be formed using a material which has lower conductivity than the anode and the cathode.

The layers which have a function of injecting electrons in the first intermediate layer 321 and the second intermediate layer 322 can be formed using, for example, an insulator or a semiconductor, such as lithium oxide, lithium fluoride, or cesium carbonate. Alternatively, the layers can be formed using a material in which a donor substance is added to a substance with high electron-transport properties.

As a substance with high electron-transport properties, the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq); or the like. Alternatively, a metal complex having an oxazole-based or thiazole-based ligand, such as bis[2-(2-hydroxyphenyl)benzoxazolato]zinc (abbreviation: Zn(BOX)$_2$), bis[2-(2-hydroxyphenyl)benzothiazolato]zinc (abbreviation: Zn(BTZ)$_2$), or the like, can be used. In addition to the metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here are mainly substances having an electron mobility of $10^{-6}$ cm$^2$/Vs or more. Note that any substance other than the above substances may be used as long as the substance has electron-transport properties which are higher than hole-transport properties.

A donor substance is added to a substance with high electron-transport properties, whereby electron-injection properties can be enhanced. Thus, the drive voltage of the light-emitting element can be reduced. As the donor substance, an alkali metal, an alkaline earth metal, a rare earth metal, a metal that belongs to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as s may be used as the donor substance.

The layers which have a function of injecting holes in the first intermediate layer 321 and the second intermediate layer 322 can be formed using, for example, a semiconductor or an insulator, such as molybdenum oxide, vanadium oxide, rhenium oxide, or ruthenium oxide. A material in which an acceptor substance is added to a substance with high hole-transport properties can be used. Alternatively, a layer formed of an acceptor substance may be used.

As a substance with high hole-transport properties, for example, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), or 4,4'-bis[N-(spiro-9,9'-bifluoren-2-yl)-N-phenylamino]-1,1'-biphenyl (BSPB), or the like. The substances given here are mainly substances having a hole mobility of $10^{-6}$ cm$^2$/Vs or more. Note that any substance other than the above substances may be used as long as the substance has hole-transport properties which are higher than electron-transport properties. Alternatively, the above host material may be used.

An acceptor substance is added to a substance with high hole-transport properties, whereby the hole-injection properties can be enhanced. Thus, the drive voltage of the light-emitting element can be reduced. As an acceptor substance, 7,7,8,8-tetracyano-2,3,5,6-tetrafluoroquinodimethane (abbreviation: F$_4$-TCNQ), chloranil, or the like can be used. Alternatively, a transition metal oxide can be used. Alternatively, an oxide of a metal belonging to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air and its hygroscopic property is low and is easily treated.

Further, with the structure in which an acceptor substance is added to a substance with high hole-transport properties and/or the structure in which a donor substance is added to a substance with high electron-transport properties, increase in the drive voltage can suppressed even in the case of increasing the thicknesses of the first intermediate layer 321 and the second intermediate layer 322. When the thicknesses of the first intermediate layer 321 and the second intermediate layer 322 are increased, a short circuit caused by a minute foreign object, impact, or the like can be prevented; thus, a highly reliable light-emitting element can be obtained.

Note that, if needed, another layer may be provided between the layer which has a function of injecting holes and the layer which has a function of injecting electrons in the intermediate layer. For example, a conductive layer formed of ITO or the like or an electron-relay layer may be provided. An electron-relay layer has a function of reducing the loss of voltage generated between the layer which has a function of injecting holes and the layer which has a function of injecting electrons. Specifically, a material whose LUMO level is greater than or equal to about −5.0 eV is preferably used, and a material whose LUMO level is greater than or equal to −5.0 eV and less than or equal to −3.0 eV is more preferably used. For example, 3,4,9,10-perylenetetracarboxylicdianhydride (abbreviation: PTCDA), 3,4,9,10-perylenetetracarboxylic-bis-benzimidazole (abbreviation: PTCBI), or the like can be used.

When voltage is applied to the above light-emitting element so that the anode 301 is positively charged and the cathode 302 is negatively charged, current with current density J flows through the light-emitting element 360. At this time, electrons are injected into the first light-emitting layer 311 from the cathode 302 and holes are injected into the first light-emitting layer 311 from the first intermediate layer 321, and when the electrons and the holes are recombined, light can be emitted from the first light-emitting unit 310. In addition, electrons are injected into the second light-emitting layer 312 from the first intermediate layer 321 and holes are injected into the second light-emitting layer 312 from the second intermediate layer 322, and when the electrons and the holes are recombined, light can be emitted from the second light-emitting unit 320. For example, the light emitted from the first light-emitting unit 310 and the second light-emitting unit 320 has the first emission spectrum 304 shown in FIG. 2. The first emission spectrum 304 has one peak.

In addition, electrons are injected into the third light-emitting layer 313 from the second intermediate layer 322 and holes are injected into the third light-emitting layer 313 from the anode 301, and when the electrons and the holes are recombined, light can be emitted from the third light-emitting unit 330. The light emitted from the third light-emitting unit 330 has the second emission spectrum 305 shown in FIG. 2. The second emission spectrum 305 has one peak.

Note that in an equivalent circuit, common current with current density J flow through the first light-emitting unit 310, the second light-emitting unit 320, and the third light-emitting unit 330, and each of the light-emitting units emit light with luminance which corresponds to the current density J. Here, a light-transmitting material is used for the first intermediate layer 321, the second intermediate layer 322, and the anode 301, whereby light emitted from the first light-emitting unit 310, light emitted from the second light-emitting unit 320, and light emitted from the third light-emitting unit 330 can all be extracted. Further, a light-reflecting material is used for the cathode 302, whereby emitted light can be reflected at the cathode 302 and extracted efficiently on the side through which light is extracted.

In the description of FIG. 1, the cathode 302 is a light-reflecting electrode; however, a structure in which the cathode 302 is a light-transmitting electrode and further a light-reflecting film is formed above the cathode 302 may be employed. A material with low electrical resistance, for example, a conductive material containing aluminum (Al), silver (Ag), or the like is preferably used for the light-reflecting electrode, in which case the power consumption of the light-emitting element can be reduced.

Further, in FIG. 1, the anode is formed on the substrate side; however, the cathode may be provided on the substrate side.

According to this embodiment, a plurality of light-emitting units whose emission spectrum peaks are located in the yellow to orange wavelength range of high luminosity are stacked, whereby the power efficiency of the whole light-emitting element can be improved. Furthermore, the color of light emitted from the light-emitting element lies close to the blackbody locus in the chromaticity diagram; thus, light of natural color like light bulb color or warm white can be achieved. Thus, a light-emitting element whose power efficiency is improved and which emits light of natural color like light bulb color or warm white can be provided.

According to this embodiment, the color of light emitted from a light-emitting element can be natural color close to the color of sunlight even in the case where the light-emitting element has a structure in which a phosphorescent compound is used for two light-emitting units which emit light of color ranging from yellow to orange and a fluorescent compound is used for one light-emitting unit which emits blue light, and the at least three light-emitting units are stacked. Thus, a light-emitting element which has high power efficiency and a long lifetime and emits light of natural color can be provided.

The light-emitting element described in this embodiment emits light of natural color (specifically, light bulb color or warm white), and thus can be used as a light source of an indoor lighting device or an outdoor lighting device. The use of the light-emitting element described in this embodiment enables a lighting device which has high power efficiency and consumes less power to be provided.

This embodiment can be combined with any of the other embodiments and examples as appropriate.

Example 1

In this example, a light-emitting element that is one embodiment of the present invention will be described with reference to FIG. 6, FIG. 9, FIG. 10, FIG. 11, FIG. 12, and FIG. 13. In addition, a comparative element 1 will be described with reference to FIG. 7, FIG. 9, FIG. 10, FIG. 11, FIG. 12, and FIG. 13. In addition, a comparative element 2 will be described with reference to FIG. 8, FIG. 9, FIG. 10, FIG. 11, FIG. 12, and FIG. 13. Chemical formulae of materials used in this example are shown below.

[Chemical Formula 1]

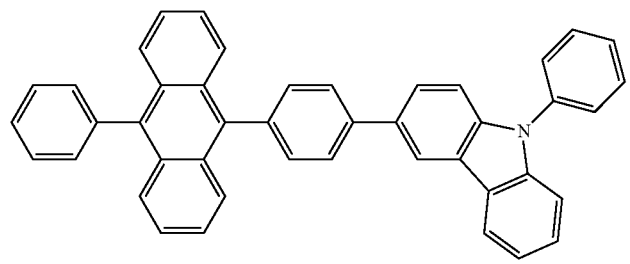

PCzPA

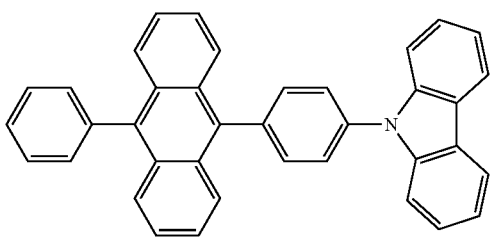

CzPA

-continued
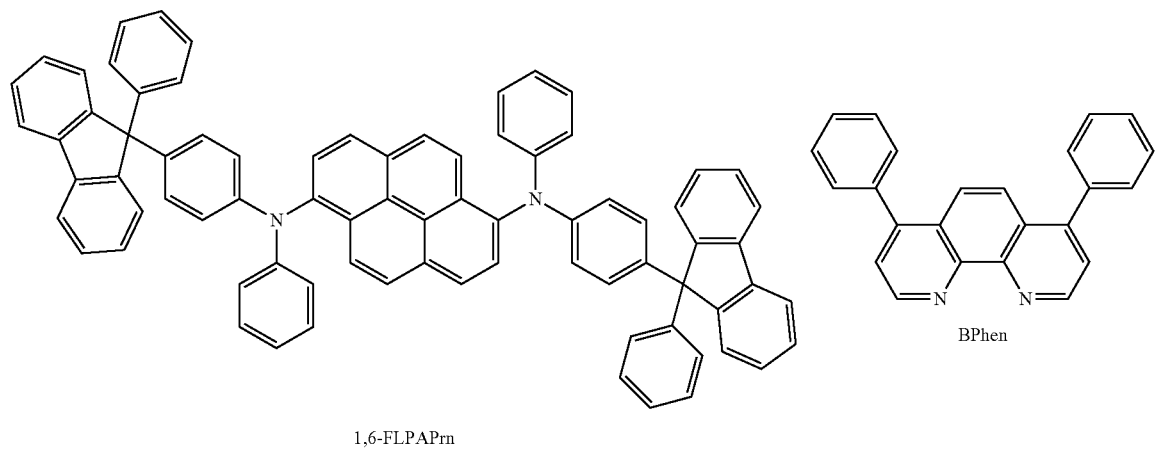
1,6-FLPAPrn
BPhen
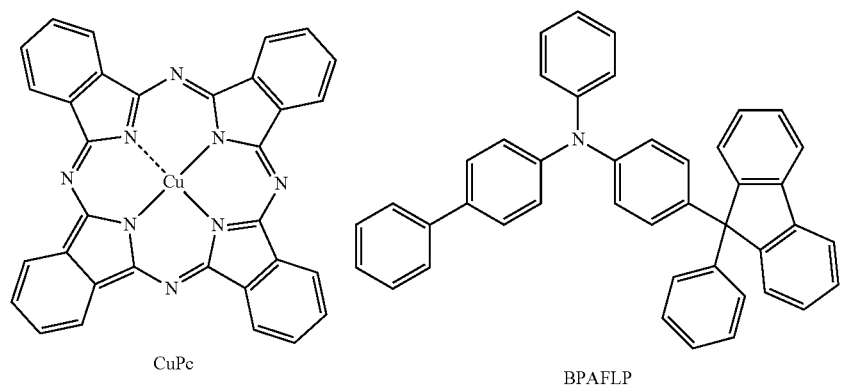
CuPc
BPAFLP
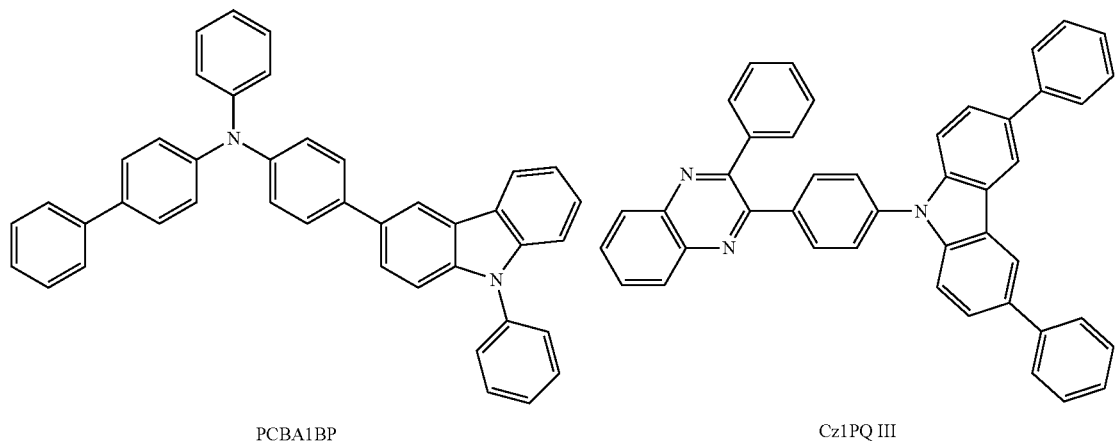
PCBA1BP
Cz1PQ III
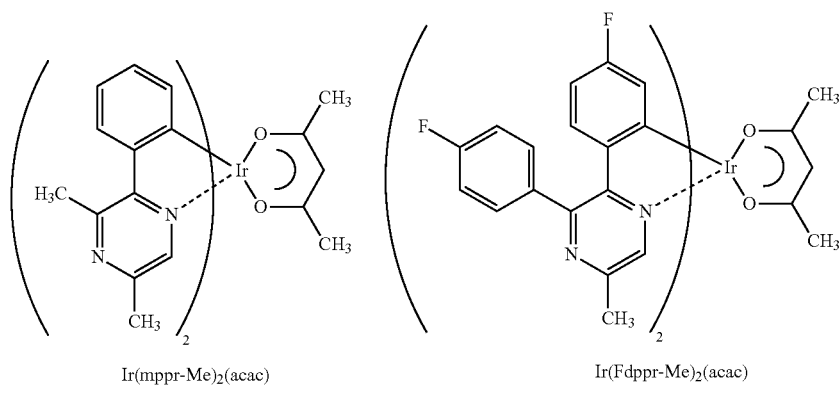
Ir(mppr-Me)₂(acac)
Ir(Fdppr-Me)₂(acac)

Manufacturing methods of a light-emitting element 1 of this example, the comparative element 1, and the comparative element 2 will be described below.

Figure 6:
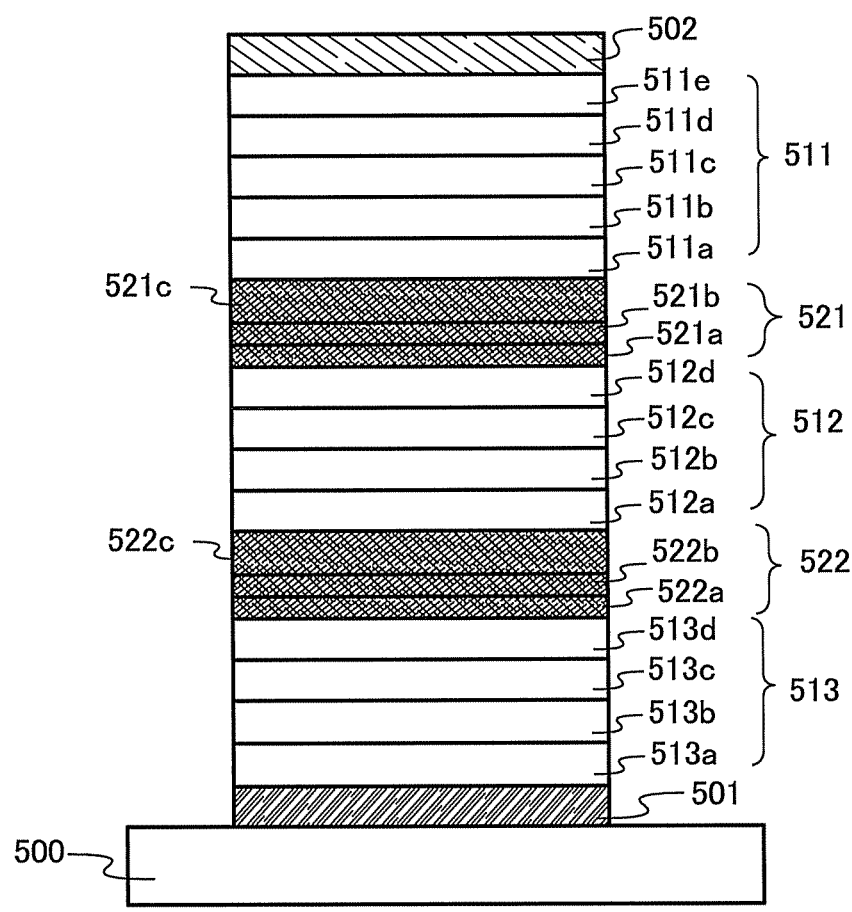
FIG. 6 illustrates an example of a light-emitting element.

First, the light-emitting element 1 will be described (see FIG. 6). Indium tin oxide containing silicon oxide was deposited by a sputtering method over a glass substrate 500 to form an anode 501. The thickness of the anode 501 was 110 nm and the electrode area was 2 mm×2 mm.

Next, the substrate on which the anode 501 was formed was fixed to a substrate holder provided in a vacuum evaporation apparatus in such a way that a surface of the substrate, on which the anode was formed, faced downward, and then the pressure was reduced to about $10^{-4}$ Pa. After that, 9-phenyl-3-[4-(10-phenyl-9-anthryl)phenyl]-9H-carbazole (abbreviation: PCzPA) that is a substance with high hole-transport properties and molybdenum(VI) oxide that is an acceptor substance were co-evaporated to form a first charge-generation layer 513a containing a composite material of an organic compound and an inorganic compound on the anode 501. The thickness of the first charge-generation layer 513a was 110 nm. The weight ratio of PCzPA to molybdenum(VI) oxide was adjusted to be 4:2 (=PCzPA:molybdenum(VI) oxide). Note that the co-evaporation method refers to an evaporation method in which evaporation is carried out from a plurality of evaporation sources at the same time in one treatment chamber. Note that, although absorption resulted from formation of a charge transfer complex is not observed, the first charge-generation layer 513a in which molybdenum oxide was added to PCzPA functions as a charge-generation layer when voltage is applied. Further, since the absorption is not observed, the charge-generation layer has excellent light-transmitting properties.

Next, PCzPA was deposited to a thickness of 10 nm on the first charge-generation layer 513a by an evaporation method using resistance heating to form a hole-transport layer 513b.

Further, a light-emitting layer 513c was formed to a thickness of 30 nm on the hole-transport layer 513b by co-evaporation of 9-[4-(10-phenyl-9-anthryl)phenyl]-9H-carbazole (abbreviation: CzPA) and N,N'-bis[4-(9-phenyl-9H-fluoren-9-yl)phenyl]-N,N'-diphenyl-pyrene-1,6-diamine (abbreviation: 1,6-FLPAPrn). Here, the weight ratio of CzPA to 1,6-FLPAPrn was adjusted to be 1:0.05 (=CzPA: 1,6-FLPAPrn). Note that CzPA is a substance with electron-transport properties and 1,6-FLPAPrn that is a guest material is a fluorescent compound which exhibits blue light emission.

After that, by an evaporation method using resistance heating, CzPA with a thickness of 5 nm and bathophenanthroline (abbreviation: BPhen) with a thickness of 15 nm were stacked in this order on the light-emitting layer 513c, whereby an electron-transport layer 513d was formed. Thus, a third light-emitting layer 513 including the first charge-generation layer 513a, the hole-transport layer 513b, the light-emitting layer 513c, and the electron-transport layer 513d was formed.

Next, lithium oxide ($Li_2O$) was evaporated to a thickness of 0.1 nm on the electron-transport layer 513d to form an electron-injection buffer 522a.

Next, an electron-relay layer 522b with a thickness of 2 nm was formed on the electron-injection buffer 522a by evaporation of copper phthalocyanine (abbreviation: CuPc).

Next, PCzPA that is a substance with high hole-transport properties and molybdenum(VI) oxide that is an acceptor substance were co-evaporated to form a second charge-generation layer 522c on the electron-relay layer 522b. The thickness of the second charge-generation layer 522c was 30 nm. The weight ratio of PCzPA to molybdenum(VI) oxide was adjusted to be 4:2 (=PCzPA:molybdenum(VI) oxide). Thus, a second intermediate layer 522 including the electron-injection buffer 522a, the electron-relay layer 522b, and the second charge-generation layer 522c was formed.

Next, a second light-emitting layer 512 was formed. The formation method thereof will be described below. First, by an evaporation method using resistance heating, 4-phenyl-4'-(9-phenylfluoren-9-yl)triphenylamine (abbreviation: BPAFLP) was deposited to a thickness of 20 nm on the second charge-generation layer 522c to form a hole-transport layer 512a.

After that, a light-emitting layer 512b with a thickness of 15 nm was formed on the hole-transport layer 512a by co-evaporation of 2-[4-(3,6-diphenyl-9H-carbazol-9-yl)phenyl]-3-phenylquinoxaline (abbreviation: Cz1PQ-III), 4-phenyl-4'-(9-phenyl-9H-carbazol-3-yl)triphenylamine (abbreviation: PCBA1BP), and (acetylacetonato)bis(3,5-dimethyl-2-phenylpyrazinato)iridium(III) (abbreviation: Ir(mppr-Me)$_2$(acac)). Here, the weight ratio of Cz1PQ-III to PCBA1BP and Ir(mppr-Me)$_2$(acac) was adjusted to be 6:2:0.6 (=Cz1PQ-III:PCBA1BP:Ir(mppr-Me)$_2$(acac)). Note that Ir(mppr-Me)$_2$(acac) is a phosphorescent compound which exhibits orange light emission. Further, a light-emitting layer 512c with a thickness of 15 nm was formed on the light-emitting layer 512b by co-evaporation of Cz1PQ-III and Ir(mppr-Me)$_2$(acac). Here, the weight ratio of Cz1PQ-III to Ir(mppr-Me)$_2$(acac) was adjusted to be 1:0.06 (=Cz1PQ-III: Ir(mppr-Me)$_2$(acac)).

Next, Cz1PQ-III with a thickness of 25 nm and BPhen with a thickness of 15 nm were stacked in this order on the light-emitting layer 512c by evaporation, whereby an electron-transport layer 512d was formed. Thus, the second light-emitting layer 512 including the hole-transport layer 512a, the light-emitting layer 512b, the light-emitting layer 512c, and the electron-transport layer 512d was formed.

Next, lithium oxide ($Li_2O$) was evaporated on the electron-transport layer 512d to a thickness of 0.1 nm to form an electron-injection buffer 521a.

Next, an electron-relay layer 521b with a thickness of 2 nm was formed on the electron-injection buffer 521a by evaporation of CuPc.

Next, PCzPA that is a substance with high hole-transport properties and molybdenum(VI) oxide that is an acceptor substance were co-evaporated to form a third charge-generation layer 521c on the electron-relay layer 521b. The thickness of the third charge-generation layer 521c was 80 nm. The weight ratio of PCzPA to molybdenum(VI) oxide was adjusted to be 4:2 (=PCzPA:molybdenum(VI) oxide). Thus, a first intermediate layer 521 including the electron-injection buffer 521a, the electron-relay layer 521b, and the third charge-generation layer 521c was formed.

Next, a first light-emitting layer 511 was formed. The formation method thereof will be described below. First, by an evaporation method using resistance heating, BPAFLP was deposited to a thickness of 20 nm on the third charge-generation layer 521c to form a hole-transport layer 511a.

After that, a light-emitting layer 511b with a thickness of 15 nm was formed on the hole-transport layer 511a by co-evaporation of Cz1PQ-III, PCBA1BP, and Ir(mppr-Me)$_2$(acac). Here, the weight ratio of Cz1PQ-III to PCBA1BP and Ir(mppr-Me)$_2$(acac) was adjusted to be 6:2:0.6 (=Cz1PQ-III: PCBA1BP:Ir(mppr-Me)$_2$(acac)). Further, a light-emitting layer 511c with a thickness of 15 nm was formed on the light-emitting layer 511b by co-evaporation of Cz1PQ-III and Ir(mppr-Me)$_2$(acac). The weight ratio of Cz1PQ-III to Ir(mppr-Me)$_2$(acac) was adjusted to be 1:0.06 (=Cz1PQ-III: Ir(mppr-Me)$_2$(acac)).

Next, Cz1PQ-III with a thickness of 25 nm and BPhen with a thickness of 15 nm were stacked in this order on the light-emitting layer 511c by evaporation, whereby an electron-transport layer 511d was formed. Lithium fluoride (LiF) was evaporated to a thickness of 1 nm on the electron-transport layer 511d to form an electron-injection layer 511e. Thus, the first light-emitting layer 511 including the hole-transport layer 511a, the light-emitting layer 511b, the light-emitting layer 511c, the electron-transport layer 511d, and the electron-injection layer 511e was formed.

Lastly, a 200-nm-thick aluminum film was formed on the electron-injection layer 511e by an evaporation method using resistance heating to form a cathode 502. Thus, the light-emitting element 1 was manufactured.

Figure 7:
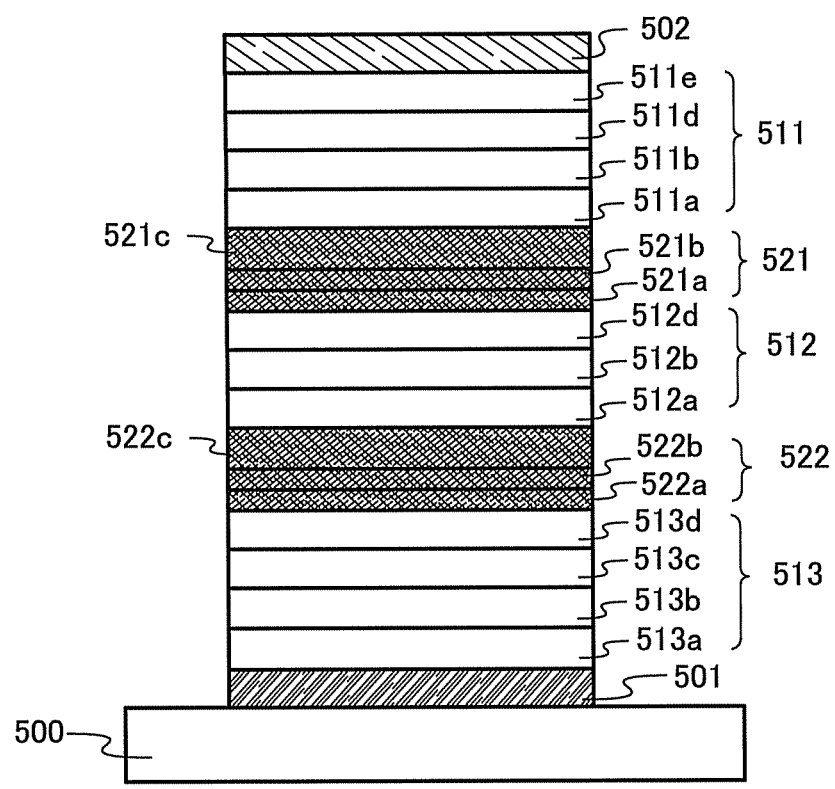
FIG. 7 illustrates an example of a comparative element.

Next, the comparative element 1 will be described (see FIG. 7). Indium tin oxide containing silicon oxide was deposited by a sputtering method on a glass substrate 500 to form an anode 501.

Next, the substrate on which the anode 501 was formed was fixed to a substrate holder provided in a vacuum evaporation apparatus in such a way that a surface of the substrate, on which the anode was formed, faced downward, and then the pressure was reduced to about $10^{-4}$ Pa. After that, BPAFLP that is a substance with high hole-transport properties and molybdenum(VI) oxide that is an acceptor substance were co-evaporated to form a first charge-generation layer 513a containing a composite material of an organic compound and an inorganic compound on the anode 501. The thickness of the first charge-generation layer 513a was 100 nm. The weight ratio of BPAFLP to molybdenum(VI) oxide was adjusted to be 4:2 (=BPAFLP:molybdenum(VI) oxide).

Next, BPAFLP was deposited to a thickness of 10 nm on the first charge-generation layer 513a by an evaporation method using resistance heating to form a hole-transport layer 513b.

Further, a light-emitting layer 513c was formed to a thickness of 30 nm on the hole-transport layer 513b by co-evaporation of CzPA and 1,6-FLPAPrn. Here, the weight ratio of CzPA to 1,6-FLPAPrn was adjusted to be 1:0.05 (=CzPA:1, 6-FLPAPrn).

After that, by an evaporation method using resistance heating, CzPA with a thickness of 5 nm and BPhen with a thickness of 15 nm were stacked in this order on the light-emitting layer 513c by evaporation, whereby an electron-transport layer 513d was formed. Thus, a third light-emitting layer 513 including the first charge-generation layer 513a, the hole-transport layer 513b, the light-emitting layer 513c, and the electron-transport layer 513d was formed.

Next, lithium oxide (Li$_2$O) was evaporated to a thickness of 0.1 nm on the electron-transport layer 513d to form an electron-injection buffer 522a.

Next, an electron-relay layer 522b with a thickness of 2 nm was formed on the electron-injection buffer 522a by evaporation of CuPc.

Next, BPAFLP that is a substance with high hole-transport properties and molybdenum(VI) oxide that is an acceptor substance were co-evaporated to form a second charge-generation layer 522c on the electron-relay layer 522b. The thickness of the second charge-generation layer 522c was 30 nm. The weight ratio of BPAFLP to molybdenum(VI) oxide was adjusted to be 4:2 (=BPAFLP:molybdenum(VI) oxide). Thus, a second intermediate layer 522 including the electron-injection buffer 522a, the electron-relay layer 522b, and the second charge-generation layer 522c was formed.

Next, a second light-emitting layer 512 was formed. The formation method thereof will be described below. First, by an evaporation method using resistance heating, BPAFLP was deposited to a thickness of 20 nm on the second charge-generation layer 522c to form a hole-transport layer 512a.

After that, a light-emitting layer 512b with a thickness of 15 nm was formed on the hole-transport layer 512a by co-evaporation of Cz1PQ-III, PCBA1BP, and (acetylacetonato) bis[2,3-bis(4-fluorophenyl)-5-methylpyrazinato]iridium(III) (abbreviation: Ir(Fdppr-Me)$_2$(acac)). Here, the weight ratio of Cz1PQ-III to PCBA1BP and Ir(Fdppr-Me)$_2$(acac) was adjusted to be 6:2:0.6 (=Cz1PQ-III:PCBA1BP:Ir(Fdppr-Me)$_2$(acac)).

Next, Cz1PQ-III with a thickness of 15 nm and BPhen with a thickness of 15 nm were stacked in this order on the light-emitting layer 512b by evaporation, whereby an electron-transport layer 512d was formed. Thus, the second light-emitting layer 512 including the hole-transport layer 512a, the light-emitting layer 512b, and the electron-transport layer 512d was formed.

Next, lithium oxide (Li$_2$O) was evaporated on the electron-transport layer 512d to a thickness of 0.1 nm to form an electron-injection buffer 521a.

Next, an electron-relay layer 521b with a thickness of 2 nm was formed on the electron-injection buffer 521a by evaporation of CuPc.

Next, BPAFLP that is a substance with high hole-transport properties and molybdenum(VI) oxide that is an acceptor substance were co-evaporated to form a third charge-generation layer 521c on the electron-relay layer 521b. The thickness of the third charge-generation layer 521c was 120 nm. The weight ratio of BPAFLP to molybdenum(VI) oxide was adjusted to be 4:2 (=BPAFLP:molybdenum(VI) oxide). Thus, a first intermediate layer 521 including the electron-injection buffer 521a, the electron-relay layer 521b, and the third charge-generation layer 521c was formed.

Next, a first light-emitting layer 511 was formed. The formation method thereof will be described below. First, by an evaporation method using resistance heating, BPAFLP was deposited to a thickness of 20 nm on the third charge-generation layer 521c to form a hole-transport layer 511a.

After that, a light-emitting layer 511b with a thickness of 15 nm was formed on the hole-transport layer 511a by co-evaporation of Cz1PQ-III, PCBA1BP, and Ir(Fdppr-Me)$_2$(acac). Here, the weight ratio of Cz1PQ-III to PCBA1BP and Ir(Fdppr-Me)$_2$(acac) was adjusted to be 6:2:0.6 (=Cz1PQ-III:PCBA1BP:Ir(Fdppr-Me)$_2$(acac)).

Next, Cz1PQ-III with a thickness of 15 nm and BPhen with a thickness of 15 nm were stacked in this order on the light-emitting layer 511b by evaporation, whereby an electron-transport layer 511d was formed. Lithium fluoride (LiF) was evaporated to a thickness of 1 nm on the electron-transport layer 511d to form an electron-injection layer 511e. Thus, the first light-emitting layer 511 including the hole-transport layer 511a, the light-emitting layer 511b, and the electron-transport layer 511d, and the electron-injection layer 511e was formed.

Lastly, a 200-nm-thick aluminum film was formed on the electron-injection layer 511e by an evaporation method using resistance heating to form a cathode 502. Thus, the comparative element 1 was manufactured.

Figure 8:
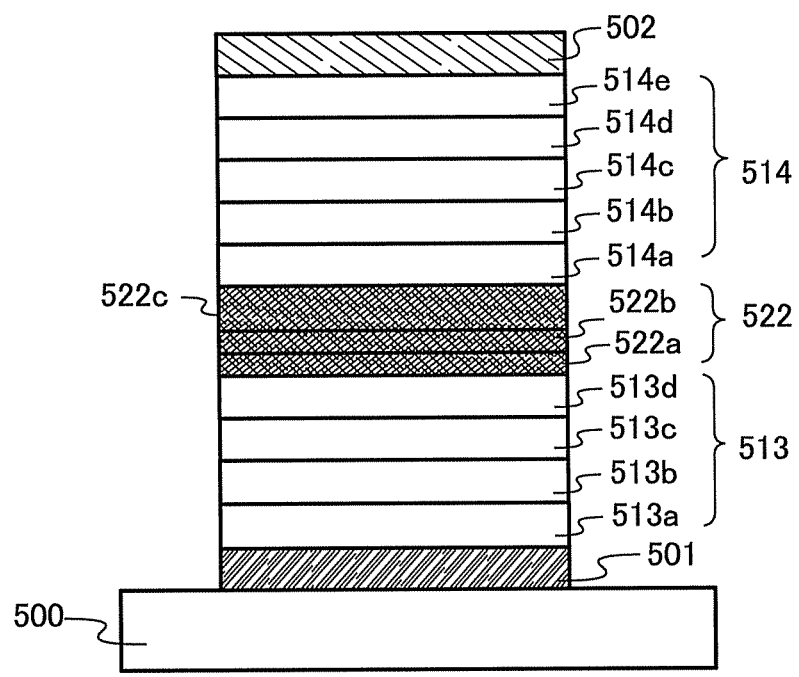
FIG. 8 illustrates an example of a comparative element.
Figure 9:
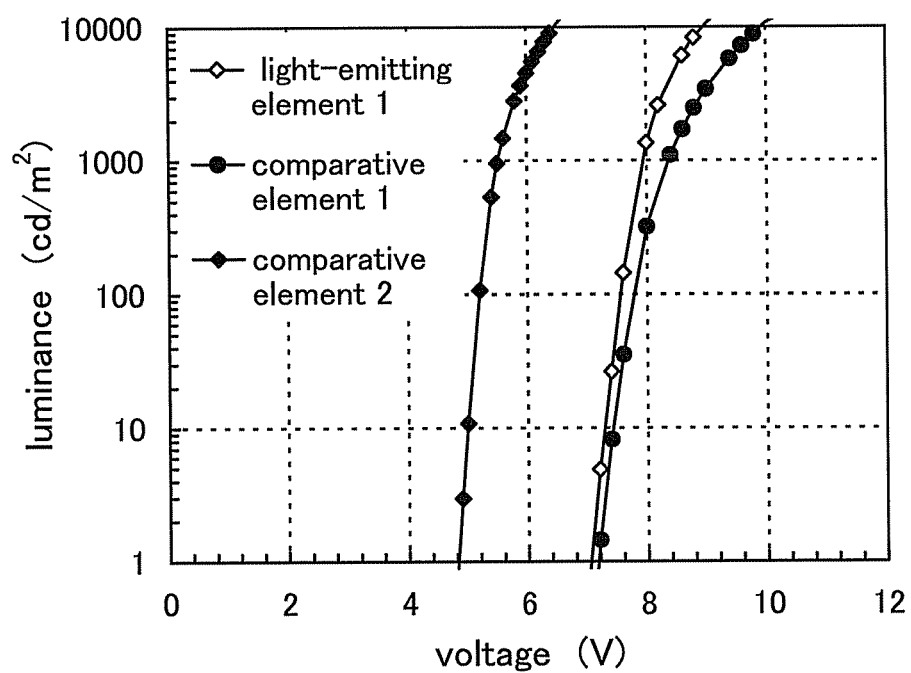
FIG. 9 shows an example of the electrical characteristics of the light-emitting element and the comparative elements.
Figure 10:
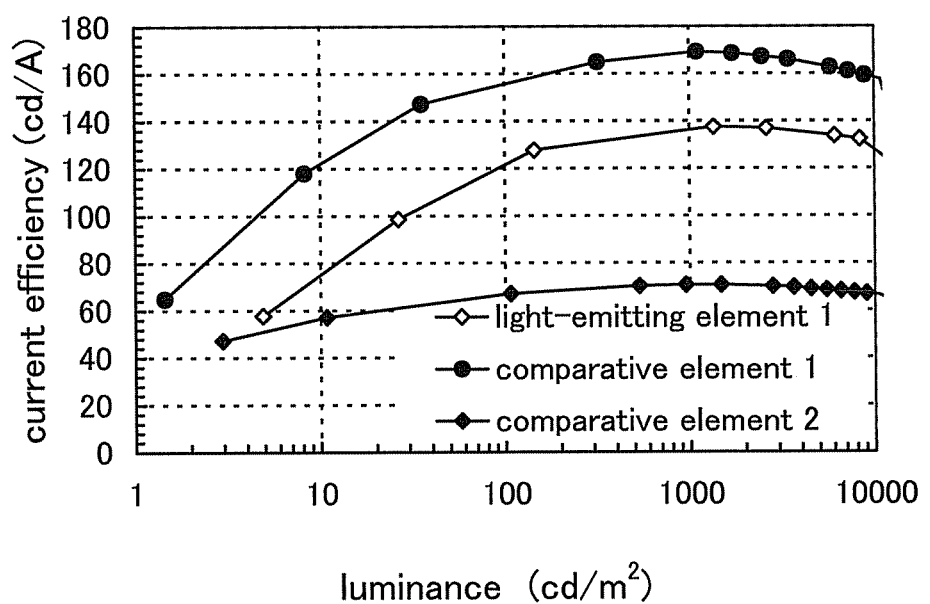
FIG. 10 shows an example of the electrical characteristics of the light-emitting element and the comparative elements.

Next, the comparative element 2 will be described (see FIG. 8). First, indium tin oxide containing silicon oxide was deposited by a sputtering method on a glass substrate 500 to form an anode 501. The thickness of the anode 501 was 110 nm and the electrode area was 2 mm×2 mm.

Next, the substrate on which the anode 501 was formed was fixed to a substrate holder provided in a vacuum evaporation apparatus in such a way that a surface of the substrate, on which the anode was formed, faced downward, and then the pressure was reduced to about $10^{-4}$ Pa. After that PCzPA that is a substance with high hole-transport properties and molybdenum(VI) oxide that is an acceptor substance were co-evaporated to form a first charge-generation layer 513a containing a composite material of an organic compound and an inorganic compound on the anode 501. The thickness of the first charge-generation layer 513a was 50 nm. The weight ratio of PCzPA to molybdenum(VI) oxide was adjusted to be 4:2 (=PCzPA:molybdenum(VI) oxide). Note that the co-evaporation method refers to an evaporation method in which evaporation is carried out from a plurality of evaporation sources at the same time in one treatment chamber.

Next, PCzPA was deposited to a thickness of 30 nm on the first charge-generation layer 513a by an evaporation method using resistance heating to form a hole-transport layer 513b.

Further, a light-emitting layer 513c was formed to a thickness of 30 nm on the hole-transport layer 513b by co-evaporation of CzPA and 1,6-FLPAPrn. Here, the weight ratio of CzPA to 1,6-FLPAPrn was adjusted to be 1:0.05 (=CzPA:1,6-FLPAPrn). Note that CzPA is a substance with electron-transport properties and 1,6-FLPAPrn that is a guest material is a fluorescent compound which exhibits blue light emission.

After that, by an evaporation method using resistance heating, CzPA with a thickness of 5 nm and BPhen with a thickness of 15 nm were stacked in this order on the light-emitting layer 513c by evaporation, whereby an electron-transport layer 513d was formed. Thus, a third light-emitting layer 513 including the first charge-generation layer 513a, the hole-transport layer 513b, the light-emitting layer 513c, and the electron-transport layer 513d was formed.

Next, lithium oxide ($Li_2O$) was evaporated to a thickness of 0.1 nm on the electron-transport layer 513d to form an electron-injection buffer 522a.

Next, an electron-relay layer 522b with a thickness of 2 nm was formed on the electron-injection buffer 522a by evaporation of CuPc.

Next, PCzPA that is a substance with high hole-transport properties and molybdenum(VI) oxide that is an acceptor substance were co-evaporated to form a second charge-generation layer 522c on the electron-relay layer 522b. The thickness of the second charge-generation layer 522c was 40 nm. The weight ratio of PCzPA to molybdenum(VI) oxide was adjusted to be 4:2 (=PCzPA:molybdenum(VI) oxide). Thus, a second intermediate layer 522 including the electron-injection buffer 522a, the electron-relay layer 522b, and the second charge-generation layer 522c was formed.

Next, a fourth light-emitting layer 514 was formed. The formation method thereof will be described below. First, by an evaporation method using resistance heating, BPAFLP was deposited to a thickness of 20 nm on the second charge-generation layer 522c to form a hole-transport layer 514a.

After that, a light-emitting layer 514b with a thickness of 15 nm was formed on the hole-transport layer 514a by co-evaporation of Cz1PQ-III, PCBA1BP, and $Ir(mppr-Me)_2$(acac). Here, the weight ratio of Cz1PQ-III to PCBA1BP and $Ir(mppr-Me)_2$(acac) was adjusted to be 6:2:0.6 (=Cz1PQ-III:PCBA1BP:$Ir(mppr-Me)_2$(acac)). Note that $Ir(mppr-Me)_2$(acac) is a phosphorescent compound which exhibits orange light emission. Further, a light-emitting layer 514c with a thickness of 15 nm was formed on the light-emitting layer 514b by co-evaporation of Cz1PQ-III and $Ir(mppr-Me)_2$(acac). Here, the weight ratio of Cz1PQ-III to $Ir(mppr-Me)_2$(acac) was adjusted to be 1:0.06 (=Cz1PQ-III:$Ir(mppr-Me)_2$(acac)).

Next, Cz1PQ-III with a thickness of 25 nm and BPhen with a thickness of 15 nm were stacked in this order on the light-emitting layer 514c by evaporation, whereby an electron-transport layer 514d was formed. Lithium fluoride (LiF) was evaporated to a thickness of 1 nm on the electron-transport layer 514d to form an electron-injection layer 514e. Thus, the fourth light-emitting layer 514 including the hole-transport layer 514a, the light-emitting layer 514b, the light-emitting layer 514c, the electron-transport layer 514d, and the electron-injection layer 514e was formed.

Lastly, a 200-nm-thick aluminum film was formed on the electron-injection layer 514e by an evaporation method using resistance heating to form a cathode 502. Thus, the comparative element 2 was manufactured.

The light-emitting element 1, the comparative element 1, and the comparative element 2 which were obtained through the above-described processes were sealed in a glove box under a nitrogen atmosphere so that the light-emitting element 1, the comparative element 1, and the comparative element 2 were not exposed to air. Then, the operation characteristics of the light-emitting element 1, the comparative element 1, and the comparative element 2 were measured. Note that the measurement was performed at room temperature (in the atmosphere kept at 25° C.).

FIG. 9, FIG. 10, FIG. 11, FIG. 12, and FIG. 13 show the voltage-luminance characteristics of the elements, the luminance-current efficiency characteristics thereof, the luminance-power efficiency characteristics thereof, the CIE chromaticity coordinates thereof, and the emission spectra thereof, respectively.

Figure 11:
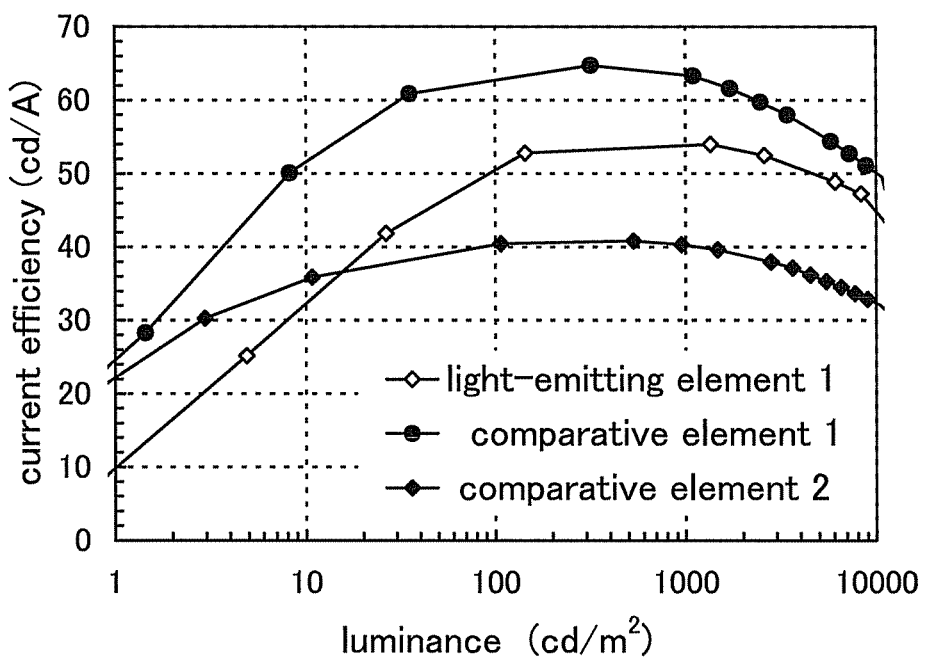
FIG. 11 shows an example of the electrical characteristics of the light-emitting element and the comparative elements.

In both the light-emitting element 1 and the comparative element 1, at least three light-emitting units are stacked. One of the at least three light-emitting units is a light-emitting unit which emits light in a wavelength range of low luminosity and the others are light-emitting units which emit light in a wavelength range of high luminosity. Thus, as shown in FIG. 11, the highest power efficiency of the light-emitting element 1 was 54 [lm/W] and the highest power efficiency of the comparative element 1 was 65 [lm/W], which are both high values.

Figure 12:
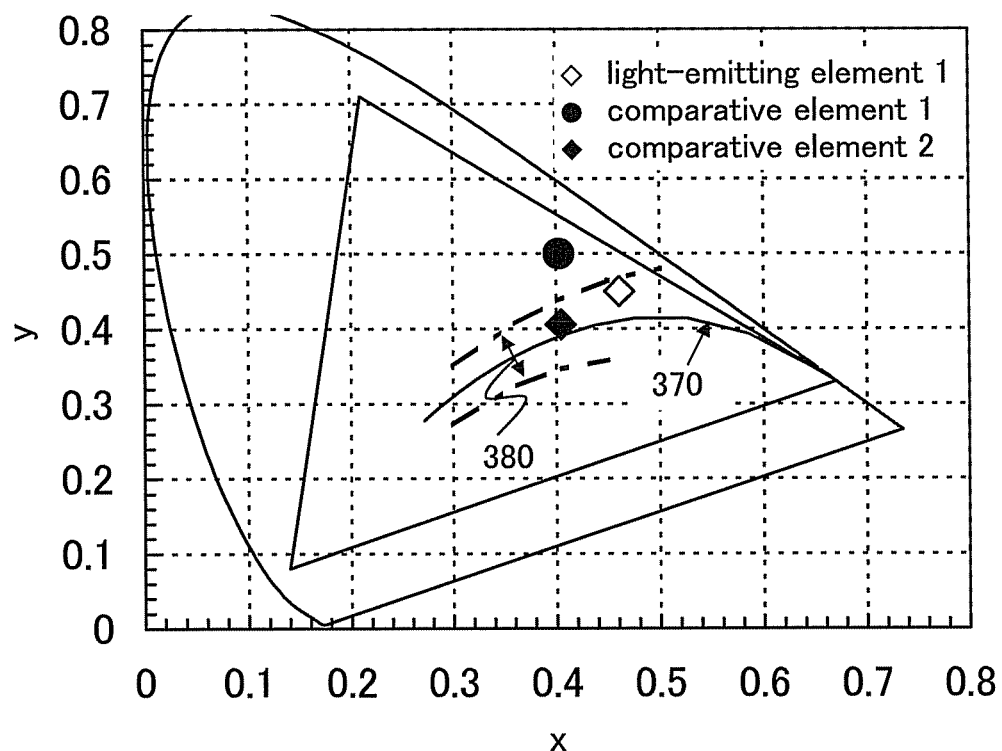
FIG. 12 shows the chromaticity coordinates and the blackbody locus of the emission spectra of the light-emitting element and the comparative elements in the chromaticity diagram.

However, as shown in FIG. 12, the CIE chromaticity coordinates of the comparative element 1 are (x, y)=(0.40, 0.50) and significantly deviate from a blackbody locus 370. Further, the CIE chromaticity coordinates also deviate from a region 380 that is in the range of ±0.02 uv from the blackbody locus 370. For those reasons, the comparative element 1 is not suitable for lighting. In contrast, the CM chromaticity coordinates of the light-emitting element 1 are (x, y)=(0.46, 0.45) and fall within the region 380 that is in the range of ±0.02 uv from the blackbody locus 370; thus, the light-emitting element 1 was found to be suitable for lighting. The light-emitting element 1 had a color temperature of 3000 K and emitted light of favorable light bulb color.

Figure 13:
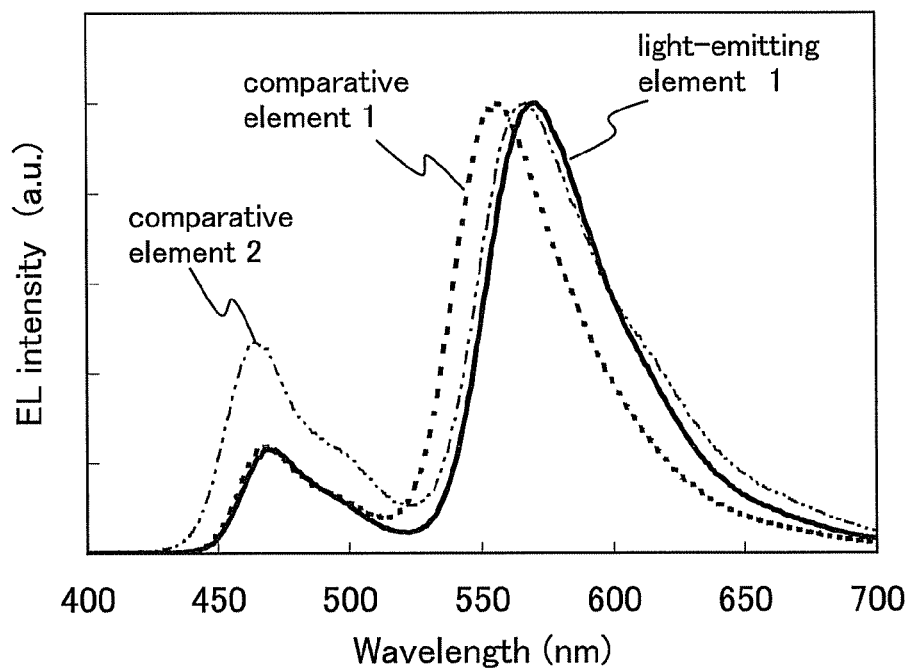
FIG. 13 shows examples of the emission spectra of the light-emitting element and the comparative elements.
Figure 14:
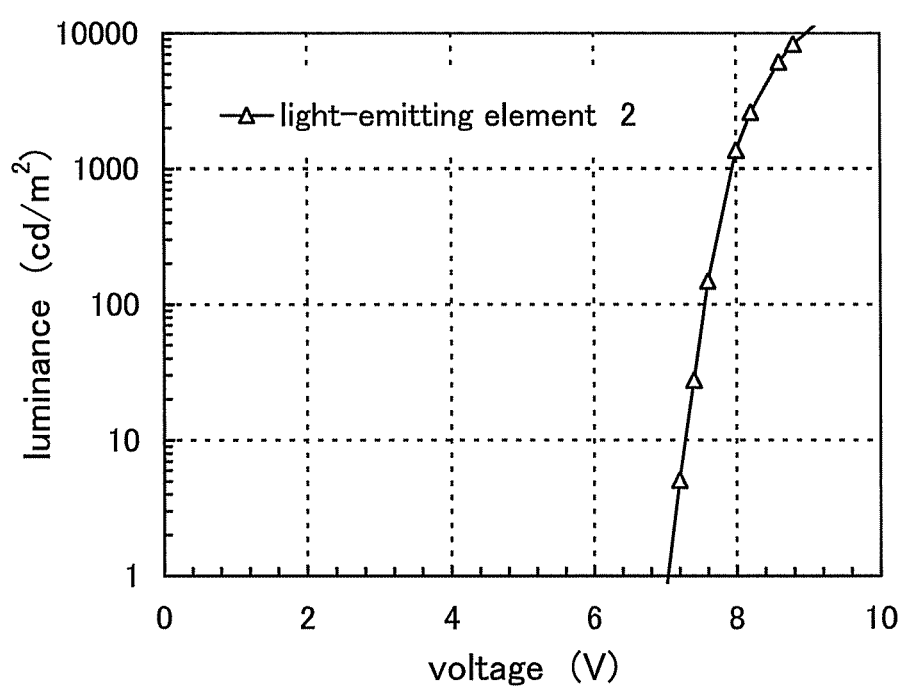
FIG. 14 shows an example of the electrical characteristics of a light-emitting element.
Figure 15:
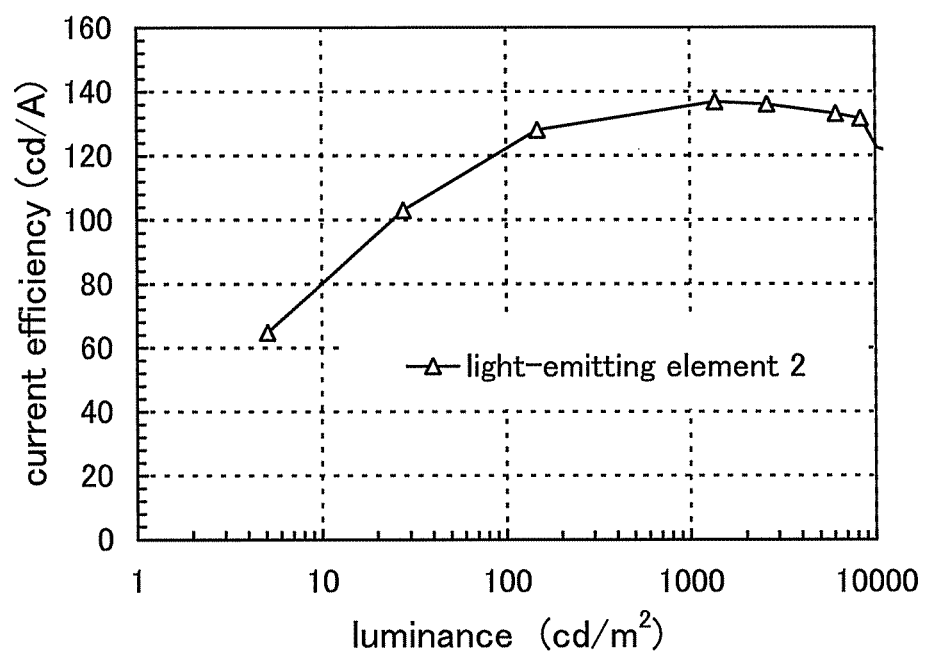
FIG. 15 shows an example of the electrical characteristics of the light-emitting element.

The emission spectra in FIG. 13 show the cause of the difference. The light-emitting element 1 has a peak of emission in a wavelength range of low luminosity of 470 nm and a peak of emission in a wavelength range of high luminosity of 570 nm. In contrast, the comparative element 1 has a peak of emission in a wavelength range of low luminosity of 469 nm and a peak of emission in a wavelength range of high luminosity of 556 nm. That is to say, the emission peak of the wavelength range of high luminosity is not appropriate.

In contrast, in the comparative element 2, two light-emitting units are stacked. One of the two light-emitting units is a light-emitting unit which emits light in a wavelength range of low luminosity and the other is a light-emitting unit which emits light in a wavelength range of high luminosity. The light-emitting unit which emits light in a wavelength range of high luminosity in the comparative element 2 has a structure similar to that in the light-emitting element 1; thus, the comparative element 2 has favorable CIE, chromaticity coordinates of (x, y)=(0.40, 0.41) as shown in FIG. 12. The color temperature is 3600 K and the comparative element 2 can be used for warm-white lighting.

However, as shown in FIG. 11, the highest power efficiency of the comparative element 2 is 41 [lm/W], which is lower than that of the light-emitting element 1. As can be seen from the emission spectra in FIG. 13, this is attributed to the fact that the intensity of emission in the wavelength range of low luminosity of the comparative element 2 is higher than that of the light-emitting element 1. In other words, since only one light-emitting unit which emits light in a wavelength range of high luminosity is used, the intensity of emission in the wavelength range of low luminosity is relatively increased, which causes decrease in power efficiency.

As described above, the light-emitting element 1 that is one embodiment of the present invention can achieve both high power efficiency and favorable light bulb color.

Example 2

In this example, a light-emitting element that is one embodiment of the present invention will be described with reference to FIG. 6, FIG. 14, FIG. 15, FIG. 16, FIG. 17, and FIG. 18.

A light-emitting element 2 of this example was manufactured in a manner similar to that of the light-emitting element 1 described in Example 1 except for a third charge-generation layer 521c. In the light-emitting element 2, the third charge-generation layer 521c was formed to a thickness of 90 nm. Accordingly, the light-emitting element 2 was obtained.

FIG. 14, FIG. 15, FIG. 16, FIG. 17, and FIG. 18 show the voltage-luminance characteristics of the light-emitting element 2, the luminance-current efficiency characteristics thereof, the luminance-power efficiency characteristics thereof, the CIE chromaticity coordinates thereof, and the emission spectrum thereof, respectively.

Figure 16:
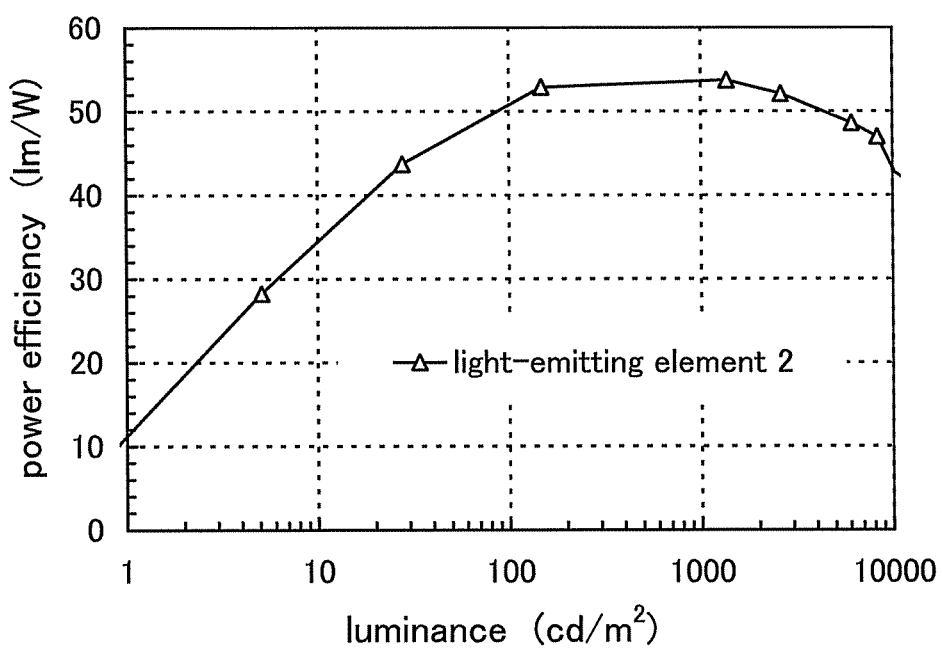
FIG. 16 shows an example of the electrical characteristics of the light-emitting element.

As shown in FIG. 16, the highest power efficiency of the light-emitting element 2 was 54 [lm/W]; thus, the light-emitting element 2 had high power efficiency.

Figure 17:
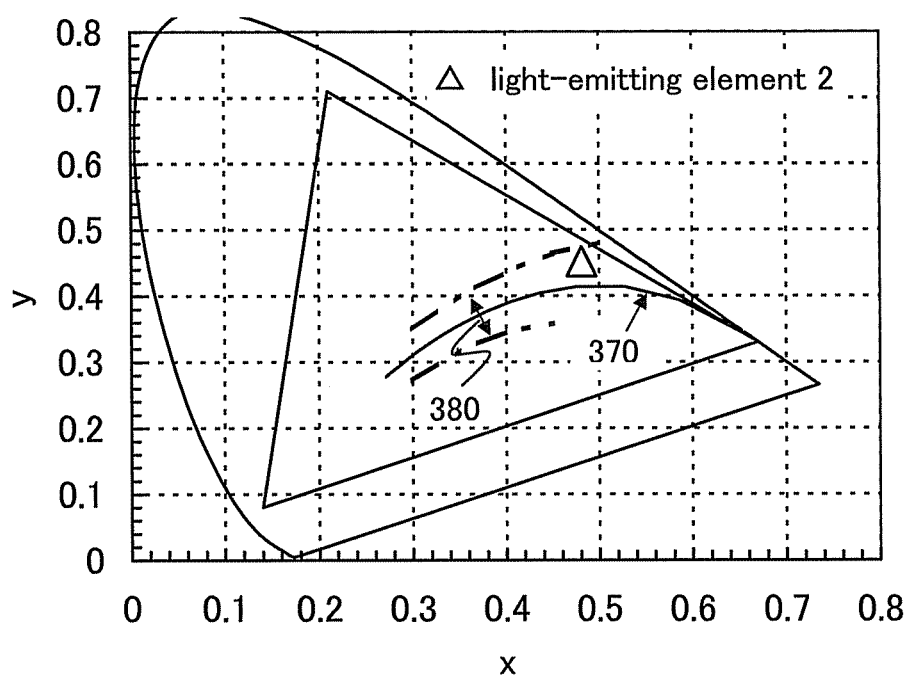
FIG. 17 shows the chromaticity coordinates and the blackbody locus of the emission spectrum of the light-emitting element in the chromaticity diagram.
Figure 18:
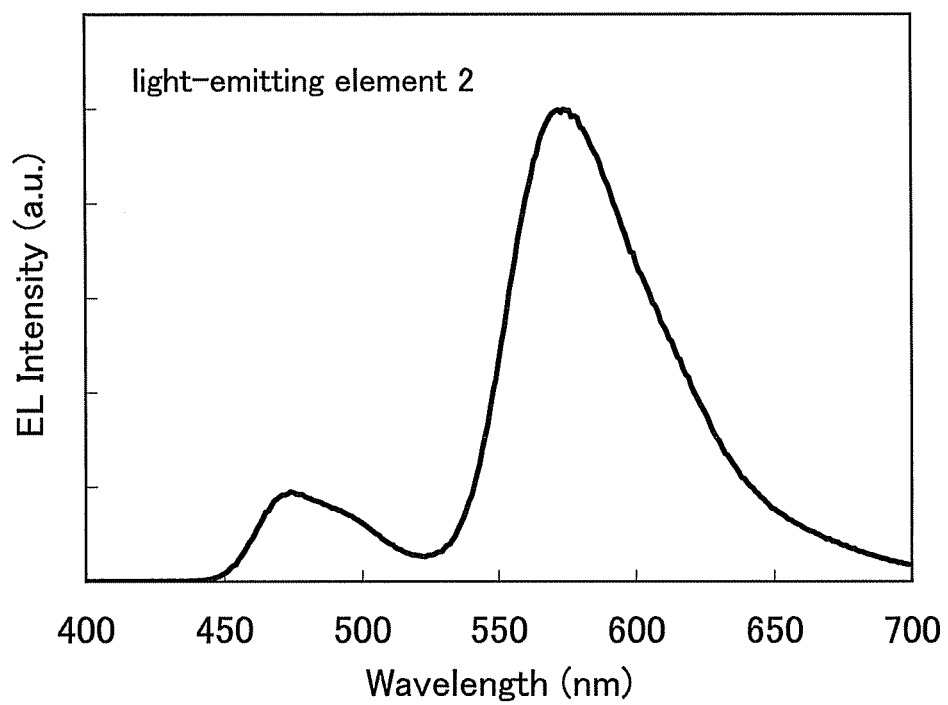
FIG. 18 shows an example of the emission spectrum of the light-emitting element.
Figure 19:
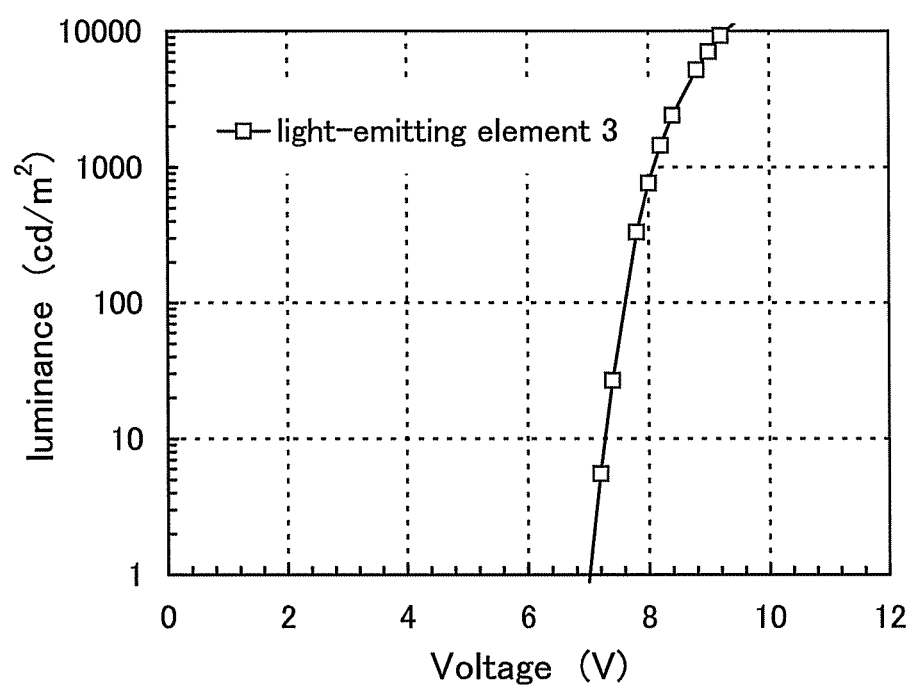
FIG. 19 shows an example of the electrical characteristics of a light-emitting element.
Figure 20:
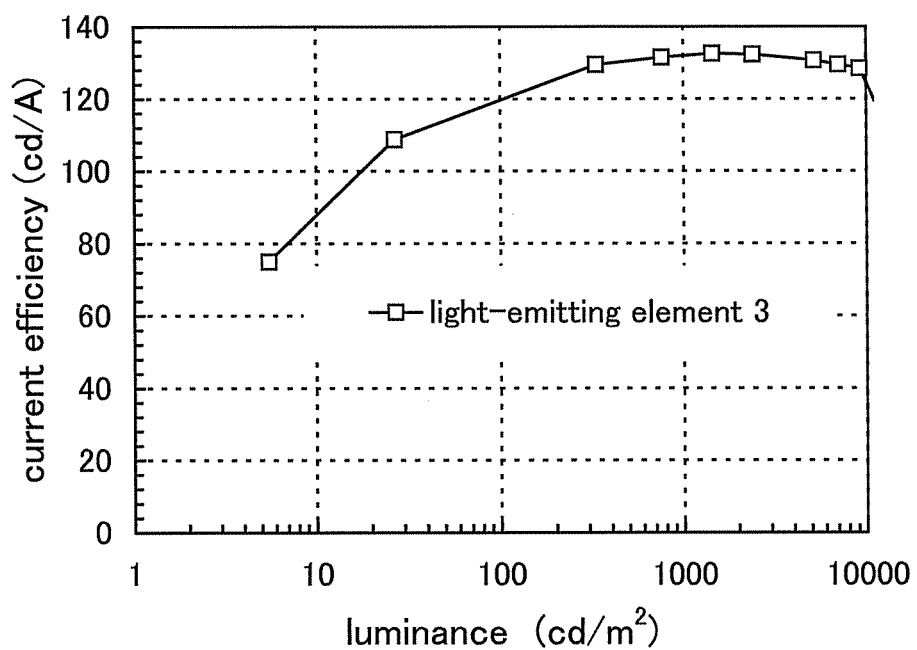
FIG. 20 shows an example of the electrical characteristics of the light-emitting element.

Further, as shown in FIG. 17, the CIE chromaticity coordinates of the light-emitting element 2 are (x, y)=(0.48, 0.45) and fall within the region 380 that is in the range of ±0.02 uv from the blackbody locus 370; thus, the light-emitting element 2 was found to be suitable for lighting. The light-emitting element 2 had a color temperature of 2700 K and emitted light of favorable light bulb color. Note that as shown in FIG. 18, the light-emitting element 2 has a peak of emission in a wavelength range of low luminosity of 474 nm and a peak of emission in a wavelength range of high luminosity of 574 nm.

Example 3

In this example, a light-emitting element that is one embodiment of the present invention will be described with reference to FIG. 6, FIG. 19, FIG. 20, FIG. 21, FIG. 22, and FIG. 23. Chemical formulae of materials used in this example are shown below. Note that the chemical formulae of the materials used in Example 1 are omitted here.

[Chemical Formula 2]

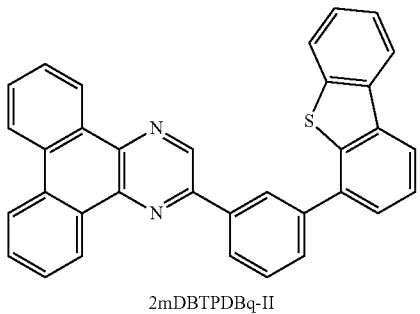

2mDBTPDBq-II

A manufacturing method of a light-emitting element 3 of this example will be described below.

The light-emitting element 3 will be described (see FIG. 6). Indium tin oxide containing silicon oxide was deposited by a sputtering method on a glass substrate 500 to form an anode 501. The thickness of the anode 501 was 110 nm and the electrode area was 2 mm×2 mm.

Next, the substrate on which the anode 501 was formed was fixed to a substrate holder provided in a vacuum evaporation apparatus in such a way that a surface of the substrate, on which the anode was formed, faced downward, and then the pressure was reduced to about $10^{-4}$ Pa. After that, PCzPA that is a substance with high hole-transport properties and molybdenum(VI) oxide that is an acceptor substance were co-evaporated to form a first charge-generation layer 513a containing a composite material of an organic compound and an inorganic compound on the anode 501. The thickness of the first charge-generation layer 513a was 90 nm. The weight ratio of PCzPA to molybdenum(VI) oxide was adjusted to be 4:2 (=PCzPA:molybdenum(VI) oxide). Note that the co-evaporation method refers to an evaporation method in which evaporation is carried out from a plurality of evaporation sources at the same time in one treatment chamber. Note that, although absorption resulted from formation of a charge transfer complex is not observed, the first charge-generation layer 513a in which molybdenum oxide was added to PCzPA functions as a charge-generation layer when voltage is applied. Further, since the absorption is not observed, the charge-generation layer has excellent light-transmitting properties.

Next, by an evaporation method using resistance heating, PCzPA was deposited to a thickness of 30 nm on the first charge-generation layer 513a to form a hole-transport layer 513b.

Further, a light-emitting layer 513c was formed to a thickness of 30 nm on the hole-transport layer 513b by co-evaporation of CzPA and 1,6-FLPAPrn. Here, the weight ratio of CzPA to 1,6-FLPAPrn was adjusted to be 1:0.05 (=CzPA:1,6-FLPAPrn). Note that CzPA is a substance with electron-transport properties and 1,6-FLPAPrn that is a guest material is a fluorescent compound which exhibits blue light emission.

After that, by an evaporation method using resistance heating, CzPA with a thickness of 5 nm and bathophenanthroline (abbreviation: BPhen) with a thickness of 15 nm were stacked in this order on the light-emitting layer 513c by evaporation, whereby an electron-transport layer 513d was formed. Thus, a third light-emitting layer 513 including the first charge-generation layer 513a, the hole-transport layer 513b, the light-emitting layer 513c, and the electron-transport layer 513d was formed.

Next, lithium oxide ($Li_2O$) was evaporated to a thickness of 0.1 nm on the electron-transport layer 513d to form an electron-injection buffer 522a.

Next, an electron-relay layer 522b with a thickness of 2 nm was formed on the electron-injection buffer 522a by evaporation of copper phthalocyanine (abbreviation: CuPc).

Next, PCzPA that is a substance with high hole-transport properties and molybdenum(VI) oxide that is an acceptor substance were co-evaporated to form a second charge-generation layer 522c on the electron-relay layer 522b. The thickness of the second charge-generation layer 522c was 30 nm. The weight ratio of PCzPA to molybdenum(VI) oxide was adjusted to be 4:2 (=PCzPA:molybdenum(VI) oxide). Thus, a second intermediate layer 522 including the electron-injection buffer 522a, the electron-relay layer 522b, and the second charge-generation layer 522c was formed.

Next, a second light-emitting layer 512 was formed. The formation method thereof will be described below. First, by an evaporation method using resistance heating, BPAFLP was deposited to a thickness of 20 nm on the second charge-generation layer 522c to form a hole-transport layer 512a.

After that, a light-emitting layer 512b with a thickness of 15 nm was formed on the hole-transport layer 512a by co-evaporation of 2-[3-(dibenzothiophen-4-yl)phenyl]dibenzo[f,h]quinoxaline (abbreviation: 2mDBTPDBq-II), PCBA1BP, and Ir(mppr-Me)$_2$(acac). Here, the weight ratio of 2mDBTPDBq-II to PCBA1BP and Ir(mppr-Me)$_2$(acac) was adjusted to be 6:2:0.6 (=2mDBTPDBq-II:PCBA1BP:Ir(mppr-Me)$_2$(acac)). Note that Ir(mppr-Me)$_2$(acac) is a phosphorescent compound which exhibits orange light emission. Further, a light-emitting layer 512c with a thickness of 15 nm was formed on the light-emitting layer 512b by co-evaporation of 2mDBTPDBq-II and Ir(mppr-Me)$_2$(acac). Here, the weight ratio of 2mDBTPDBq-II to Ir(mppr-Me)$_2$(acac) was adjusted to be 1:0.06 (=2mDBTPDBq-II:Ir(mppr-Me)$_2$(acac)).

Next, 2mDBTPDBq-II with a thickness of 25 nm and BPhen with a thickness of 15 nm were stacked in this order on the light-emitting layer 512c by evaporation, whereby an electron-transport layer 512d was formed. Thus, the second light-emitting layer 512 including the hole-transport layer 512a, the light-emitting layer 512b, the light-emitting layer 512c, and the electron-transport layer 512d was formed.

Next, lithium oxide ($Li_2O$) was evaporated on the electron-transport layer 512d to a thickness of 0.1 nm to form an electron-injection buffer 521a.

Next, an electron-relay layer 521b with a thickness of 2 nm was formed on the electron-injection buffer 521a by evaporation of CuPc.

Next, PCzPA that is a substance with high hole-transport properties and molybdenum(VI) oxide that is an acceptor substance were co-evaporated to form a third charge-generation layer 521c on the electron-relay layer 521b. The thickness of the third charge-generation layer 521c was 100 nm. The weight ratio of PCzPA to molybdenum(VI) oxide was adjusted to be 4:2 (=PCzPA:molybdenum(VI) oxide). Thus, a first intermediate layer 521 including the electron-injection buffer 521a, the electron-relay layer 521b, and the third charge-generation layer 521c was formed.

Next, a first light-emitting layer 511 was formed. The formation method thereof will be described below. First, by an evaporation method using resistance heating, BPAFLP was deposited to a thickness of 20 nm on the third charge-generation layer 521c to form a hole-transport layer 511a.

After that, a light-emitting layer 511b with a thickness of 15 nm was formed on the hole-transport layer 511a by co-evaporation of 2mDBTPDBq-II, PCBA1BP, and Ir(mppr-Me)$_2$(acac). Here, the weight ratio of 2mDBTPDBq-II to PCBA1BP and Ir(mppr-Me)$_2$(acac) was adjusted to be 6:2:0.6 (=2mDBTPDBq-II:PCBA1BP:Ir(mppr-Me)$_2$(acac)). Further, a light-emitting layer 511c with a thickness of 15 nm was formed on the light-emitting layer 511b by co-evaporation of 2mDBTPDBq-II and Ir(mppr-Me)$_2$(acac). The weight ratio of 2mDBTPDBq-II to Ir(mppr-Me)$_2$(acac) was adjusted to be 1:0.06 (=2mDBTPDBq-II:Ir(mppr-Me)$_2$(acac)).

Next, 2mDBTPDBq-II with a thickness of 25 nm and BPhen with a thickness of 15 nm were stacked in this order on the light-emitting layer 511c by evaporation, whereby an electron-transport layer 511d was formed. Lithium fluoride (LiF) was evaporated to a thickness of 1 nm on the electron-transport layer 511d to form an electron-injection layer 511e. Thus, the first light-emitting layer 511 including the hole-transport layer 511a, the light-emitting layer 511b, the light-emitting layer 511c, and the electron-transport layer 511d, and the electron-injection layer 511e was formed.

Lastly, by an evaporation method using resistance heating, a 200-nm-thick aluminum film was formed on the electron-injection layer 511e to form a cathode 502. Thus, the light-emitting element 3 was manufactured.

FIG. 19, FIG. 20, FIG. 21, FIG. 22, and FIG. 23 show the voltage-luminance characteristics of the light-emitting element 3, the luminance-current efficiency characteristics thereof, the luminance-power efficiency characteristics thereof, the CIE chromaticity coordinates thereof, and the emission spectrum thereof, respectively.

Figure 21:
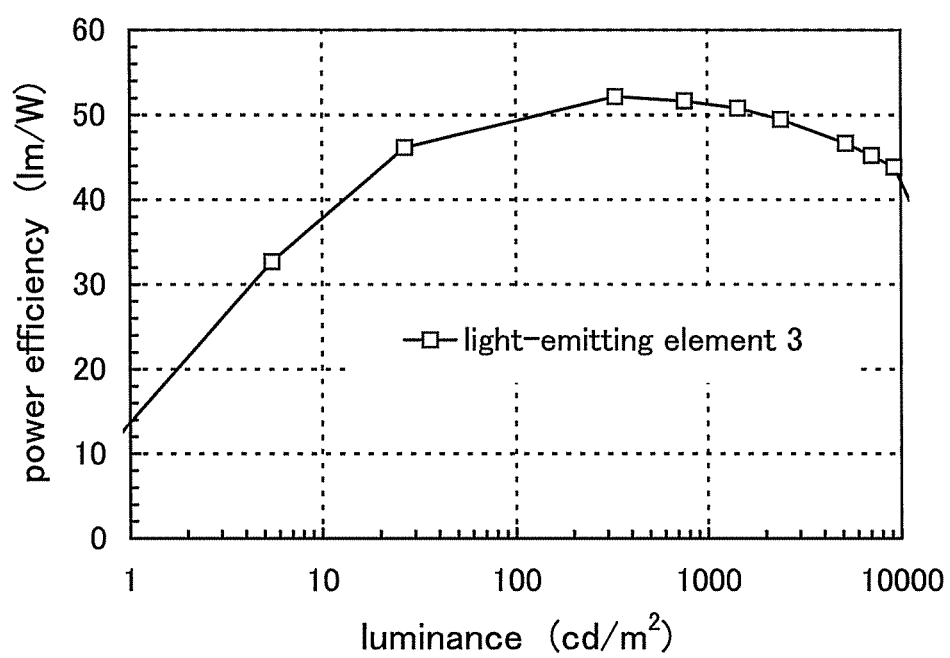
FIG. 21 shows an example of the electrical characteristics of the light-emitting element.

As shown in FIG. 21, the highest power efficiency of the light-emitting element 3 was 52 [lm/W]; thus, the light-emitting element 3 had high power efficiency.

Figure 22:
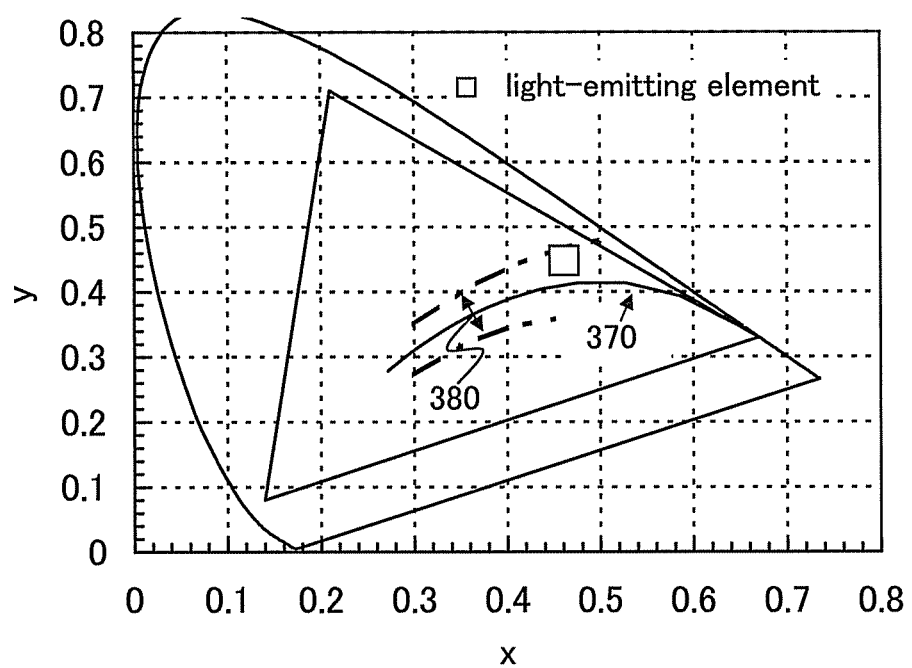
FIG. 22 shows the chromaticity coordinates and the blackbody locus of the emission spectrum of the light-emitting element in the chromaticity diagram.
Figure 23:
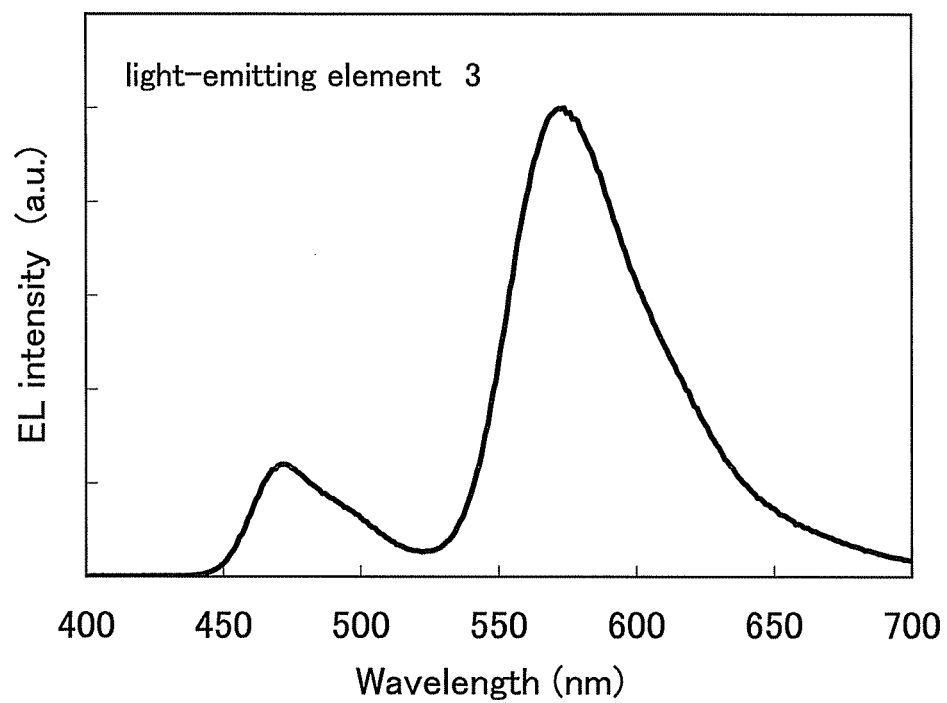
FIG. 23 shows the emission spectrum of the light-emitting element.

Further, as shown in FIG. 22, the CIE chromaticity coordinates of the light-emitting element 3 are (x, y)=(0.46, 0.45) and fall within the region 380 that is in the range of ±0.02 uv from the blackbody locus 370; thus, the light-emitting element 3 was found to be suitable for lighting. The light-emitting element 3 had a color temperature of 3000 K and emitted light of favorable light bulb color. Note that as shown in FIG. 23, the light-emitting element 3 has a peak of emission in a wavelength range of low luminosity of 471 nm and a peak of emission in a wavelength range of high luminosity of 574 nm.

Example 4

In this example, a light-emitting element that is one embodiment of the present invention will be described with reference to FIG. 24, FIG. 25, FIG. 26, FIG. 27, FIG. 28, and FIG. 29. Chemical formulae of materials used in this example are shown below. Note that the chemical formulae of the materials used in Example 1 and Example 3 are omitted here.

[Chemical Formulae 3]

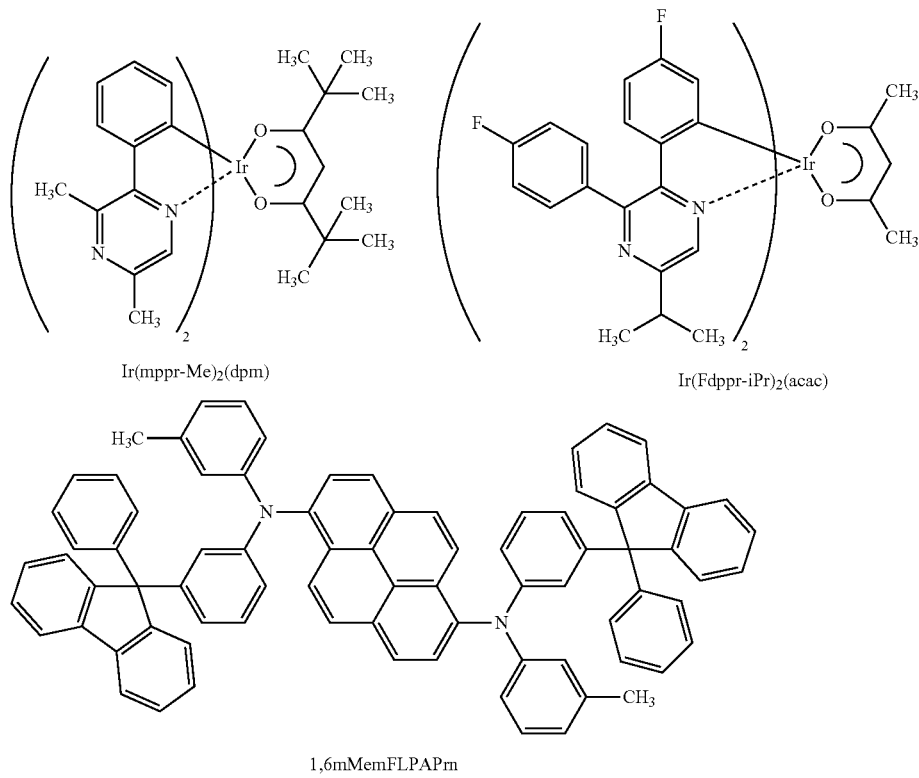

Ir(mppr-Me)₂(dpm)    Ir(Fdppr-iPr)₂(acac)

1,6mMemFLPAPrn

A manufacturing method of a light-emitting element 4 of this example will be described below.

Figure 24:
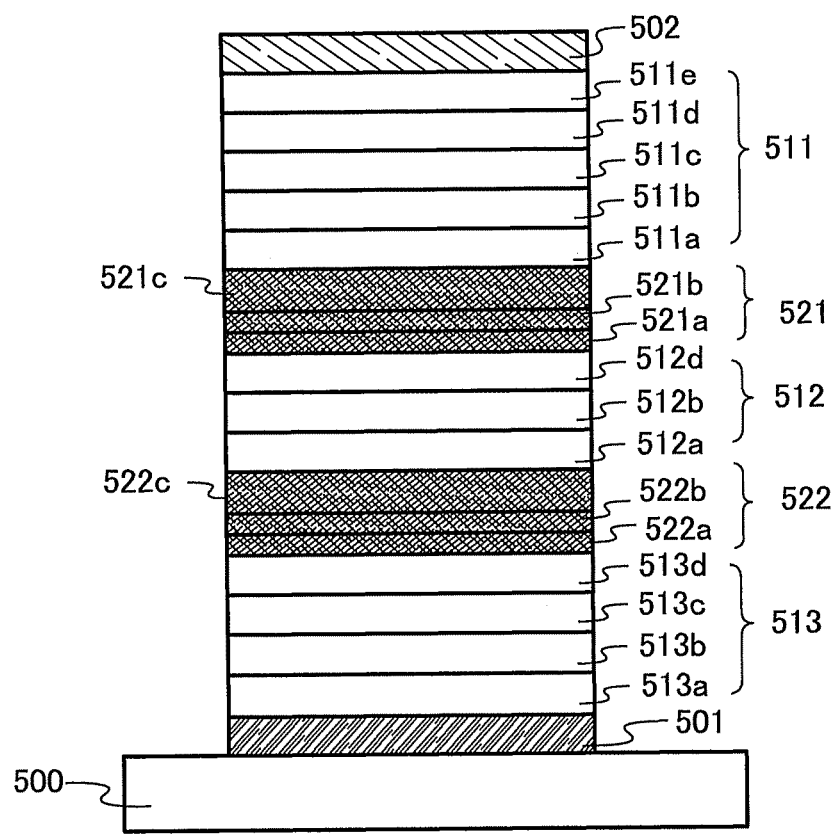
FIG. 24 illustrates an example of a light-emitting element.
Figure 25:
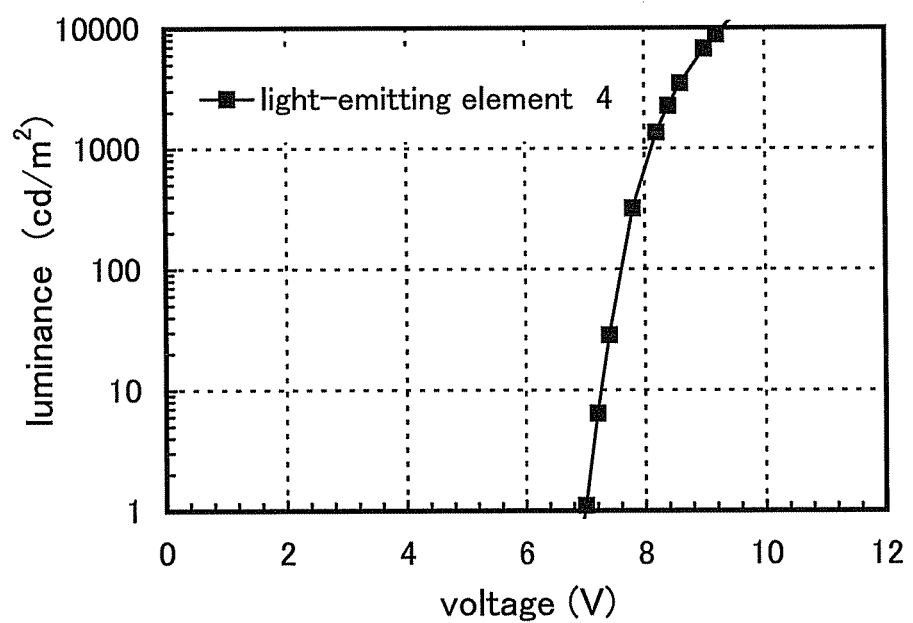
FIG. 25 shows an example of the electrical characteristics of the light-emitting element.
Figure 26:
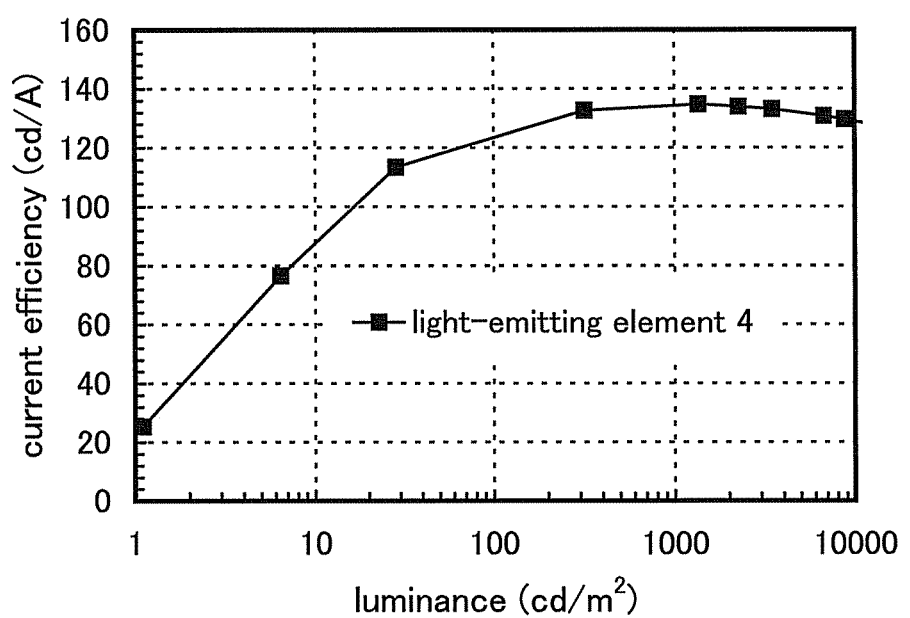
FIG. 26 shows an example of the electrical characteristics of the light-emitting element.

The light-emitting element 4 will be described (see FIG. 24). Indium tin oxide containing silicon oxide was deposited by a sputtering method on a glass substrate 500 to form an anode 501. The thickness of the anode 501 was 110 nm and the electrode area was 2 mm×2 mm.

Next, the substrate on which the anode 501 was formed was fixed to a substrate holder provided in a vacuum evaporation apparatus in such a way that a surface of the substrate, on which the anode was formed, faced downward, and then the pressure was reduced to about $10^{-4}$ Pa. After that, PCzPA that is a substance with high hole-transport properties and molybdenum(VI) oxide that is an acceptor substance were co-evaporated to form a first charge-generation layer 513a containing a composite material of an organic compound and an inorganic compound on the anode 501. The thickness of the first charge-generation layer 513a was 110 nm. The weight ratio of PCzPA to molybdenum(VI) oxide was adjusted to be 1:0.5 (=PCzPA:molybdenum(VI) oxide). Note that the co-evaporation method refers to an evaporation method in which evaporation is carried out from a plurality of evaporation sources at the same time in one treatment chamber. Note that, although absorption resulted from a charge transfer complex is not observed, the first charge-generation layer 513a in which molybdenum oxide was added to PCzPA functions as a charge-generation layer when voltage is applied. Further, since the absorption is not observed, the charge-generation layer has excellent light-transmitting properties.

Next, by an evaporation method using resistance heating, PCzPA was deposited to a thickness of 30 nm on the first charge-generation layer 513a to form a hole-transport layer 513b.

Further, a light-emitting layer 513c was formed to a thickness of 30 nm on the hole-transport layer 513b by co-evaporation of CzPA and N,N'-bis(3-methylphenyl)-N,N'-bis[3-(9-phenyl-9H-fluoren-9-yl)phenyl]pyrene-1,6-diamine (abbreviation: 1,6mMemFLPAPrn). Here, the weight ratio of CzPA to 1,6mMemFLPAPrn was adjusted to be 1:0.05 (=CzPA: 1,6mMemFLPAPrn). Note that CzPA is a substance with electron-transport properties and 1,6mMemFLPAPrn that is a guest material is a fluorescent compound which exhibits blue light emission.

After that, by an evaporation method using resistance heating, CzPA with a thickness of 5 nm and bathophenanthroline (abbreviation: BPhen) with a thickness of 15 nm were stacked in this order on the light-emitting layer 513c by evaporation, whereby an electron-transport layer 513d was formed. Thus, a third light-emitting layer 513 including the first charge-generation layer 513a, the hole-transport layer 513b, the light-emitting layer 513c, and the electron-transport layer 513d was formed.

Next, lithium oxide (Li₂O) was evaporated to a thickness of 0.1 nm on the electron-transport layer 513d to form an electron-injection buffer 522a.

Next, an electron-relay layer 522b with a thickness of 2 nm was formed on the electron-injection buffer 522a by evaporation of copper phthalocyanine (abbreviation: CuPc).

Next, PCzPA that is a substance with high hole-transport properties and molybdenum(VI) oxide that is an acceptor substance were co-evaporated to form a second charge-generation layer 522c on the electron-relay layer 522b. The thickness of the second charge-generation layer 522c was 30 nm. The weight ratio of PCzPA to molybdenum(VI) oxide was adjusted to be 1:0.5 (=PCzPA:molybdenum(VI) oxide). Thus, a second intermediate layer 522 including the electron-injection buffer 522a, the electron-relay layer 522b, and the second charge-generation layer 522c was formed.

Next, a second light-emitting layer 512 was formed. The formation method thereof will be described below. First, by an evaporation method using resistance heating, BPAFLP was deposited to a thickness of 20 nm on the second charge-generation layer 522c to form a hole-transport layer 512a.

After that, a light-emitting layer 512b with a thickness of 30 nm was formed on the hole-transport layer 512a by co-evaporation of 2mDBTPDBq-II, PCBA1BP, and (acetylacetonato)bis[5-isopropyl-2,3-bis(4-fluorophenyl)pyrazinato]iridium(III) (abbreviation: Ir(Fdppr-iPr)$_2$(acac)). Here, the weight ratio of 2mDBTPDBq-II to PCBA1BP and Ir(Fdppr-iPr)$_2$(acac) was adjusted to be 6:2:0.6 (=2mDBTPDBq-II:PCBA1BP:Ir(Fdppr-iPr)$_2$(acac)). Note that Ir(Fdppr-iPr)$_2$(acac) is a phosphorescent compound which exhibits yellow light emission.

Next, 2mDBTPDBq-II with a thickness of 25 nm and BPhen with a thickness of 15 nm were stacked in this order on the light-emitting layer 512b by evaporation, whereby an electron-transport layer 512d was formed. Thus, the second light-emitting layer 512 including the hole-transport layer 512a, the light-emitting layer 512b, and the electron-transport layer 512d was formed.

Next, lithium oxide (Li$_2$O) was evaporated on the electron-transport layer 512d to a thickness of 0.1 nm to form an electron-injection buffer 521a.

Next, an electron-relay layer 521b with a thickness of 2 nm was formed on the electron-injection buffer 521a by evaporation of CuPc.

Next, PCzPA that is a substance with high hole-transport properties and molybdenum(VI) oxide that is an acceptor substance were co-evaporated to form a third charge-generation layer 521c on the electron-relay layer 521b. The thickness of the third charge-generation layer 521c was 100 nm. The weight ratio of PCzPA to molybdenum(VI) oxide was adjusted to be 1:0.5 (=PCzPA:molybdenum(VI) oxide). Thus, a first intermediate layer 521 including the electron-injection buffer 521a, the electron-relay layer 521b, and the third charge-generation layer 521c was formed.

Next, a first light-emitting layer 511 was formed. The formation method thereof will be described below. First, by an evaporation method using resistance heating, BPAFLP was deposited to a thickness of 20 nm on the third charge-generation layer 521c to form a hole-transport layer 511a.

After that, a light-emitting layer 511b with a thickness of 15 nm was formed on the hole-transport layer 511a by co-evaporation of 2mDBTPDBq-II, PCBA1BP, and (dipivaloylmethanato)bis(3,5-dimethyl-2-phenylpyrazinato)iridium(III) (abbreviation: Ir(mppr-Me)$_2$(dpm)). Here, the weight ratio of 2mDBTPDBq-II to PCBA1BP and Ir(mppr-Me)$_2$(dpm) was adjusted to be 6:2:0.6 (=2mDBTPDBq-II:PCBA1BP:Ir(mppr-Me)$_2$(dpm)). Further, a light-emitting layer 511c with a thickness of 15 nm was formed on the light-emitting layer 511b by co-evaporation of 2mDBTPDBq-II and Ir(mppr-Me)$_2$(dpm). The weight ratio of 2mDBTPDBq-II to Ir(mppr-Me)$_2$(dpm) was adjusted to be 1:0.06 (=2mDBTPDBq-II:Ir(mppr-Me)$_2$(dpm)).

Next, 2mDBTPDBq-II with a thickness of 25 nm and BPhen with a thickness of 15 nm were stacked in this order on the light-emitting layer 511c by evaporation, whereby an electron-transport layer 511d was formed. Lithium fluoride (LiF) was evaporated to a thickness of 1 nm on the electron-transport layer 511d to form an electron-injection layer 511e. Thus, the first light-emitting layer 511 including the hole-transport layer 511a, the light-emitting layer 511b, the light-emitting layer 511c, and the electron-transport layer 511d, and the electron-injection layer 511e was formed.

Lastly, by an evaporation method using resistance heating, a 200-nm-thick aluminum film was formed on the electron-injection layer 511e to form a cathode 502. Thus, the light-emitting element 4 was manufactured.

FIG. 25, FIG. 26, FIG. 27, FIG. 28, and FIG. 29 show the voltage-luminance characteristics of the light-emitting element 4, the luminance-current efficiency characteristics thereof, the luminance-power efficiency characteristics thereof, the CIE chromaticity coordinates thereof, and the emission spectrum thereof, respectively.

Figure 27:
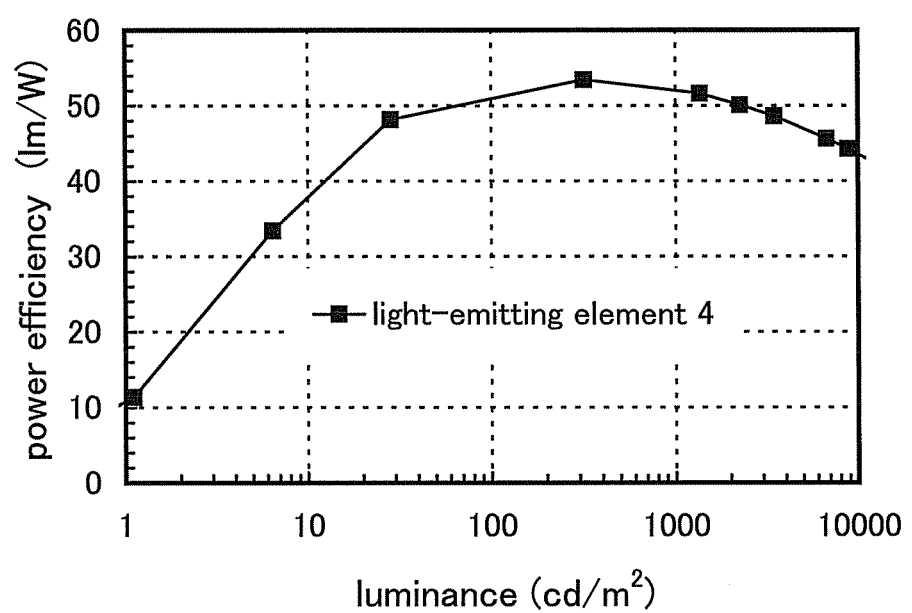
FIG. 27 shows an example of the electrical characteristics of the light-emitting element.
Figure 28:
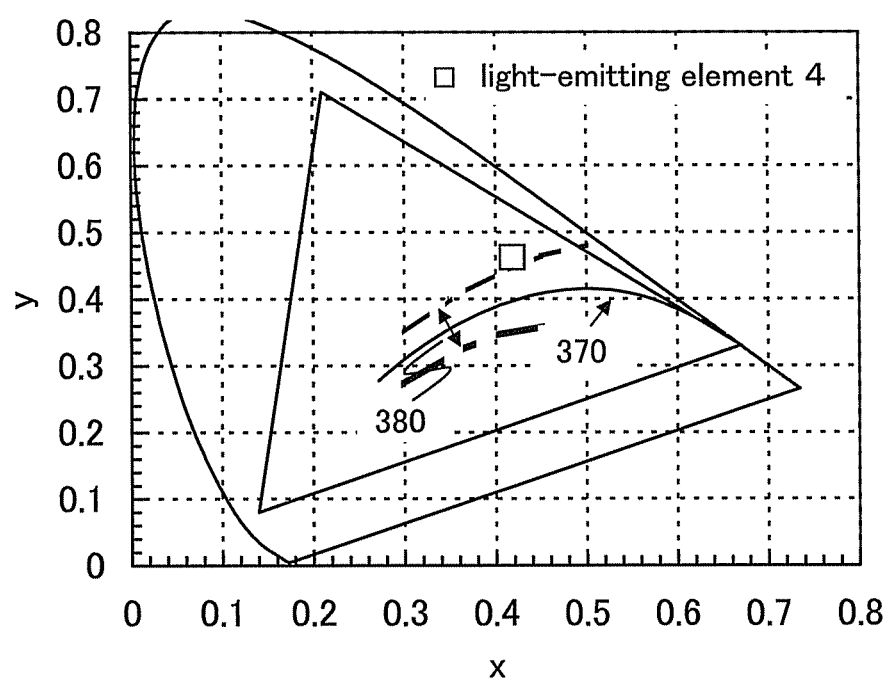
FIG. 28 shows the chromaticity coordinates and the blackbody locus of the emission spectrum of the light-emitting element in the chromaticity diagram.
Figure 29:
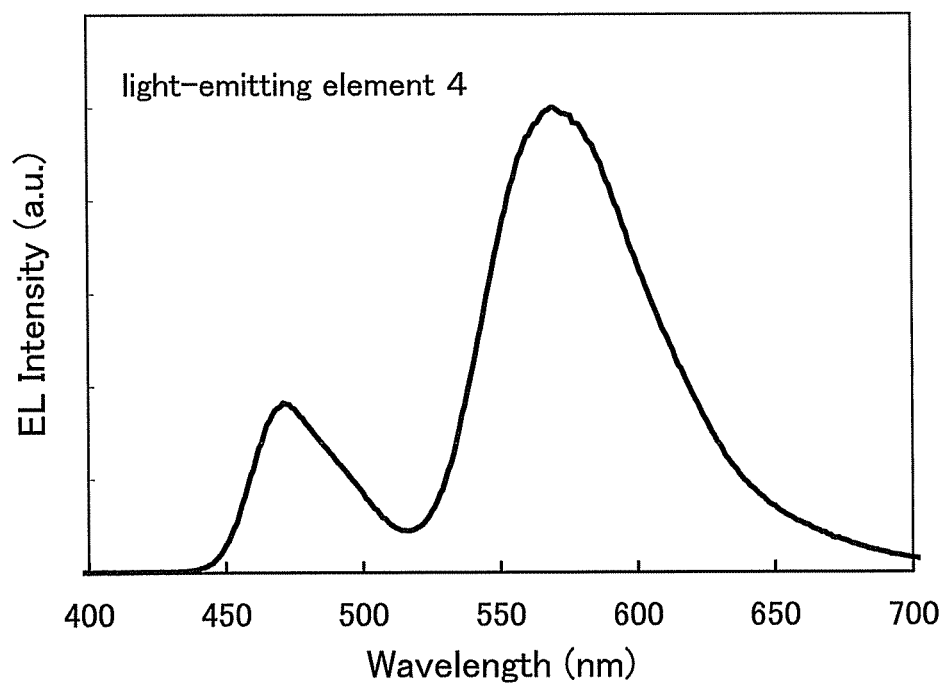
FIG. 29 shows an example of the emission spectrum of the light-emitting element.

As shown in FIG. 27, the highest power efficiency of the light-emitting element 4 was 51 [lm/W]; thus, the light-emitting element 4 had high power efficiency.

This application is based on Japanese Patent Application serial no. 2010-045987 filed with Japan Patent Office on Mar. 2, 2010, the entire contents of which are hereby incorporated by reference.

What is claimed is:

1. A light-emitting element comprising:
    an anode;
    a cathode; and
    a first light-emitting layer, a second light-emitting layer, a third light-emitting layer, a first intermediate layer, and a second intermediate layer between the anode and the cathode,
    wherein the first intermediate layer is provided between the first light-emitting layer and the second light-emitting layer,
    wherein the second intermediate layer is provided between the second light-emitting layer and the third light-emitting layer,
    wherein a spectrum of light emitted from each of two of the first to third light-emitting layers has a peak in a yellow to orange wavelength range,
    wherein an emission spectrum obtained by combining the spectra of light emitted from the two of the first to third light-emitting layers has a peak of which a wavelength is greater than or equal to 560 nm and less than 580 nm, and
    wherein a spectrum of light emitted from the other of the first to third light-emitting layers has a peak in a blue wavelength range.

2. The light-emitting element according to claim 1,
    wherein one of the anode and the cathode, the first light-emitting layer and
    the first intermediate layer constitute a first light-emitting unit,
    wherein the first intermediate layer, the second light-emitting layer and the second intermediate layer constitute a second light-emitting unit, and
    wherein the second intermediate layer, the third light-emitting layer and the other of the anode and the cathode constitute a third light-emitting unit.

3. The light-emitting element according to claim 1,
    wherein the two of the first to third light-emitting layers each contain a light-emitting substance, the light-emitting substance being a phosphorescent compound.

4. The light-emitting element according to claim 1,
    wherein the other of the first to third light-emitting layers contains a light-emitting substance, the light-emitting substance being a fluorescent compound.

5. The light-emitting element according to claim 1,
    wherein the two of the first to third light-emitting layers each contain a first light-emitting substance, the first light-emitting substance being a phosphorescent compound, and wherein the other of the first to third light-emitting layers contains a second light-emitting substance, the second light-emitting substance being a fluorescent compound.

6. The light-emitting element according to claim 3, wherein the phosphorescent compound includes an organometallic complex in which a pyrazine derivative serves as a ligand.

7. The light-emitting element according to claim 5, wherein the phosphorescent compound includes an organometallic complex in which a pyrazine derivative serves as a ligand.

8. The light-emitting element according to claim 4, wherein the fluorescent compound includes a pyrene diamine derivative.

9. The light-emitting element according to claim 5, wherein the fluorescent compound includes a pyrene diamine derivative.

10. The light-emitting element according to claim 1, wherein color of light obtained by combining light having a peak in the yellow to orange wavelength range and having a wavelength of the peak of greater than or equal to 560 nm and less than 580 nm and light having a peak in the blue wavelength range is in the range of ±0.02 uv from a blackbody locus in a chromaticity diagram.

11. A light-emitting element comprising:
at least three stacked light-emitting units,
wherein an emission spectrum of the light-emitting element has two peaks,
wherein one of the two peaks is a peak obtained by combining spectra of light emitted from two of the at least three stacked light-emitting units,
wherein the peak is in a yellow to orange wavelength range and the wavelength of the peak is greater than or equal to 560 nm and less than 580 nm, and
wherein the other of the two peaks is in a blue wavelength range.

12. The light-emitting element according to claim 11, wherein the two of the at least three stacked light-emitting units each have a peak of an emission spectrum in the yellow to orange wavelength range.

13. The light-emitting element according to claim 11, wherein the two of the at least three stacked light-emitting units each contain a light-emitting substance having a peak of an emission spectrum in the yellow to orange wavelength range, the light-emitting substance being a phosphorescent compound.

14. The light-emitting element according to claim 13, wherein the phosphorescent compound includes an organometallic complex in which a pyrazine derivative serves as a ligand.

15. The light-emitting element according to claim 11, wherein the other one of the at least three stacked light-emitting units contains a light-emitting substance having a peak of an emission spectrum in the blue wavelength range, the light-emitting substance being a fluorescent compound.

16. The light-emitting element according to claim 15, wherein the fluorescent compound includes a pyrene diamine derivative.

17. The light-emitting element according to claim 11, wherein color of light obtained by combining light having the peak in the yellow to orange wavelength range and having a wavelength of the peak of greater than or equal to 560 nm and less than 580 nm and light having the peak in the blue wavelength range is in the range of ±0.02 uv from a blackbody locus in a chromaticity diagram.

18. A lighting device comprising the light-emitting element according to claim 1 used as a light source.

19. A lighting device comprising the light-emitting element according to claim 11 used as a light source.

* * * * *